United States Patent
Bowman et al.

(10) Patent No.: US 11,967,484 B2
(45) Date of Patent: Apr. 23, 2024

(54) ION CURRENT DROOP COMPENSATION

(71) Applicant: EAGLE HARBOR TECHNOLOGIES, INC., Seattle, WA (US)

(72) Inventors: Christopher Bowman, Seattle, WA (US); Connor Liston, Seattle, WA (US); Kenneth Miller, Seattle, WA (US); Timothy Ziemba, Bainbridge Island, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 214 days.

(21) Appl. No.: 17/493,835

(22) Filed: Oct. 4, 2021

(65) Prior Publication Data

US 2022/0037122 A1 Feb. 3, 2022

Related U.S. Application Data

(63) Continuation-in-part of application No. 17/372,398, filed on Jul. 9, 2021, now Pat. No. 11,404,247.

(60) Provisional application No. 63/087,150, filed on Oct. 2, 2020, provisional application No. 63/049,907, filed on Jul. 9, 2020.

(51) Int. Cl.
*H01J 37/32* (2006.01)
*H01J 49/24* (2006.01)

(52) U.S. Cl.
CPC .. *H01J 37/32146* (2013.01); *H01J 37/32174* (2013.01)

(58) Field of Classification Search
CPC .......... H01J 37/32174; H01J 37/32091; H01J 37/32348; H01J 37/32146; H01J 2237/2485; H01J 37/241; H01J 37/32082; H01J 37/321
See application file for complete search history.

(56) References Cited

U.S. PATENT DOCUMENTS

| | | |
|---|---|---|
| 9,706,630 B2 | 7/2017 | Miller et al. |
| 9,960,763 B2 | 5/2018 | Miller et al. |
| 10,020,800 B2 | 7/2018 | Prager et al. |
| 10,373,755 B2 | 8/2019 | Prager et al. |
| 10,460,911 B2 | 10/2019 | Ziemba et al. |
| 10,607,814 B2 | 3/2020 | Ziemba et al. |
| 2012/0052599 A1 | 3/2012 | Brouk et al. |

(Continued)

FOREIGN PATENT DOCUMENTS

WO   2020/146436 A1   7/2020

OTHER PUBLICATIONS

International Search Report and Written Opinion in PCT Application No. PCT/US2021/053436 dated Feb. 8, 2022, 14 pages.

*Primary Examiner* — Wei (Victor) Y Chan

(57) ABSTRACT

A pulse generator is disclosed. The pulse generator includes a DC source; a plurality of switches, a transformer; and a pulsing output. The pulse generator can be coupled with a plasma chamber. The pulsing output outputs high voltage pulses having a peak-to-peak voltage greater than 1 kV and a voltage portion between consecutive high voltage bipolar pulses that has a negative slope that substantially offsets the voltage reduction on a wafer within a plasma chamber due to an ion current. The resulting voltage at the wafer may be substantially flat between consecutive pulses.

14 Claims, 17 Drawing Sheets

(56) References Cited

U.S. PATENT DOCUMENTS

| | | | |
|---|---|---|---|
| 2015/0184284 A1* | 7/2015 | Elghazzali | H01J 37/3467 |
| | | | 204/192.12 |
| 2019/0393791 A1 | 12/2019 | Ziemba et al. | |
| 2020/0035458 A1 | 1/2020 | Ziemba et al. | |
| 2020/0244254 A1 | 7/2020 | Slobodov et al. | |
| 2022/0013329 A1 | 1/2022 | Bowman et al. | |

\* cited by examiner

ION CURRENT DROOP COMPENSATION

CROSS-REFERENCE TO RELATED APPLICATIONS

This application claims priority to U.S. Provisional Patent Application No. 63/087,150 filed Oct. 2, 2020, titled "ION CURRENT DROOP COMPENSATION," which is incorporated by reference in its entirety.

This application is a continuation-in-part application of U.S. Non-Provisional application Ser. No. 17/372,398, filed Jul. 9, 2021, titled "ION CURRENT DROOP COMPENSATION," which is incorporated by reference in its entirety, which claims priority to U.S. Provisional Patent Application No. 63/049,907 filed Jul. 9, 2020, titled "ION CURRENT DROOP COMPENSATION," which is incorporated by reference in its entirety.

BACKGROUND

Some plasma systems include at least two power supplies. One that produces high frequency waveforms that can be used to create a plasma within the plasma chamber. The other produces high voltage pulses that accelerate charged plasma particles toward a wafer within the plasma chamber.

SUMMARY

A nanosecond pulser is disclosed. The nanosecond pulser may include one or more solid state switches; a transformer coupled with the one or more solid state switches; a snubber circuit coupled with the one or more switches; an output coupled with the transformer that produces high voltage pulses with a pulse repetition frequency, a pulse width, a peak voltage greater than 1 kV, and a produces a voltage portion between consecutive high voltage pulses that has a negative slope.

The voltage portion, for example, may include more than 50% of the period between consecutive pulses. The voltage portion may be the voltage between the knee of the fall of a pulse and a knee of the rise of a consecutive pulse. The voltage portion, for example, may be the voltage between the end of a pulse and a beginning of a consecutive pulse.

The high voltage pulses, for example, may be non-sinusoidal pulses.

The magnitude of the negative slope, for example, may be greater than 100,000 kV/s.

The snubber circuit may include a snubber resistor having a resistance of about 7.5 mΩ-1.25Ω; and/or a snubber capacitor having a capacitance of about 2 µF-35 µF.

The pulse width may have a duration of about 100-500 ns.

A semiconductor processing system is also disclosed that includes a plasma chamber; and the nanosecond pulser coupled with the plasma chamber to introduce the high voltage pulses into the plasma chamber. The voltage portion between two consecutive high voltage pulses measured at at least one point within the plasma chamber, for example, may change less than 1 V/ns. The magnitude of the negative slope, for example, may be substantially equal and opposite the ratio of an ion current produced within the plasma chamber and a chuck capacitance of the plasma chamber. The magnitude of the negative slope, for example, may be substantially equal and opposite the ratio of an ion current produced within the plasma chamber and a chuck capacitance of the plasma chamber. The magnitude of the negative slope, for example, may substantially offset a voltage reduction on a wafer within the plasma chamber due to an ion current.

The plasma chamber, for example, may include a chuck having a capacitance less than about 20 nF.

A pulse generator is disclosed. The pulse generator may include: a DC source; a transformer comprising: a transformer core; a primary winding wrapped around at least a portion of the transformer core, the primary winding having a first lead and a second lead; and a secondary winding wrapped around at least a portion of the transformer core. The pulse generator may also include a droop compensation circuit electrically coupled with first lead of the primary winding; a first switch electrically connected with the droop compensation circuit and the DC source; a second switch electrically connected with the second lead of the primary winding and the DC source, wherein the first switch and the second switch are opened and closed at different time intervals; and a pulsing output electrically coupled with the secondary winding of the transformer that outputs high voltage bipolar pulses having a peak-to-peak voltage greater than 1 kV and a voltage portion between consecutive high voltage bipolar pulses that has a negative slope. The pulsing output, for example, may output bipolar pulses with pulse frequencies greater than 1 kHz.

The voltage portion, for example, may include more than 50% of the period between consecutive high voltage bipolar pulses. The voltage portion may be the voltage between the knee of the fall of a high voltage bipolar pulse and a knee of the rise of a consecutive high voltage bipolar pulse. The voltage portion, for example, may be the voltage between the end of a high voltage bipolar pulse and a beginning of a consecutive high voltage bipolar pulse.

The magnitude of the negative slope, for example, may be greater than 100,000 kV/s.

The droop compensation circuit, for example, may include a droop diode biased to allow current to flow through the first switch and through the transformer. The droop compensation circuit, for example, may include a first inductor and a first resistor arranged in series and electrically coupled across the droop diode. The first inductor, for example, may be a variable inductor. The first inductor, for example, may have an inductance less than about 100 µH. The first resistor, for example, may have a resistance less than about 5Ω. The droop circuit, for example, may include a second inductor electrically coupled with the droop diode and the first lead of the primary winding. The second inductor, for example, may have an inductance is less than about 50 nH.

The pulse generator, for example, may include a third resistor and a third inductor arranged in series between the second switch and the second lead of the primary winding. The third inductor may have an inductance less than about 35 nH. The third resistor, for example, may have a resistance less than about 1Ω.

A semiconductor processing system is also disclosed that includes a plasma chamber; and the pulse generator according coupled with the plasma chamber to introduce the high voltage pulses into the plasma chamber.

The voltage portion between two consecutive high voltage pulses measured at at least one point within the plasma chamber may change less than 1 V/ns. The magnitude of the negative slope, for example, may be substantially equal and opposite the ratio of an ion current produced within the plasma chamber and a chuck capacitance of the plasma chamber. The magnitude of the negative slope, for example, may be substantially offsets a voltage reduction on a wafer within the plasma chamber due to an ion current.

A pulse generator is disclosed. The pulse generator may include: a DC source; a transformer comprising: a transformer core; a primary winding wrapped around at least a portion of the transformer core, the primary winding having a first lead and a second lead; and a secondary winding wrapped around at least a portion of the transformer core. The pulse generator may also include a plurality of switches arranged in a full-bridge arrangement. A first portion of the plurality of switches may be electrically connected with the droop compensation circuit and the DC source. A second portion of the plurality of switches may be electrically connected with the second lead of the primary winding and the DC source. The first portion of the plurality of switches and the second portion of the plurality of switches may be opened and closed at different time intervals. The pulse generator may also include a droop compensation circuit electrically arranged between the first portion of the plurality of switches and/or the second portion of the plurality of switches and the transformer, the droop compensation circuit. The pulse generator may also include a pulsing output electrically coupled with the secondary winding of the transformer that outputs first high voltage bipolar pulses having a peak-to-peak voltage greater than about 1 kV, with pulse frequencies greater than 1 kHz, and a voltage portion between consecutive high voltage bipolar pulses that has a negative slope. The pulsing output, for example, may output bipolar pulses with pulse frequencies greater than 1 kHz.

The voltage portion, for example, may include more than 50% of the period between consecutive high voltage bipolar pulses. The voltage portion may be the voltage between the knee of the fall of a high voltage bipolar pulse and a knee of the rise of a consecutive high voltage bipolar pulse. The voltage portion, for example, may be the voltage between the end of a high voltage bipolar pulse and a beginning of a consecutive high voltage bipolar pulse.

The magnitude of the negative slope, for example, may be greater than 100,000 kV/s.

The droop compensation circuit, for example, may include a droop diode biased to allow current to flow through the first switch and through the transformer. The droop compensation circuit, for example, may include a first inductor and a first resistor arranged in series and electrically coupled across the droop diode. The first inductor, for example, may have an inductance less than about 100 μH. The first resistor, for example, may have a resistance less than about 5Ω. The droop circuit, for example, may include a second inductor electrically coupled with the droop diode and the first lead of the primary winding. The second inductor, for example, may have an inductance is less than about 50 nH.

The pulse generator, for example, may include a third resistor and a third inductor arranged in series between the second switch and the second lead of the primary winding. The third inductor may have an inductance less than about 35 nH. The third resistor, for example, may have a resistance less than about 1Ω.

A semiconductor processing system is also disclosed that includes a plasma chamber; and the pulse generator according coupled with the plasma chamber to introduce the high voltage pulses into the plasma chamber.

The voltage portion between two consecutive high voltage pulses measured at least one point within the plasma chamber may change less than 1 V/ns. The magnitude of the negative slope, for example, may be substantially equal and opposite the ratio of an ion current produced within the plasma chamber and a chuck capacitance of the plasma chamber. The magnitude of the negative slope, for example, may be substantially offsets a voltage reduction on a wafer within the plasma chamber due to an ion current.

A pulsing power supply is disclosed that provides a plurality of high voltage pulses without any substantial voltage droop between two subsequent pulses as measured at a point within a load such as, for example, on a wafer withing a plasma chamber.

A pulsing power supply is disclosed that provides a waveform of voltage versus time having a plurality of high voltage pulses having a voltage greater than 1 kV and with a substantially constant voltage between pulses as measured at a point within a load such as, for example, on a wafer withing a plasma chamber.

A pulsing power supply is disclosed that provides a waveform of voltage versus time having a plurality of high voltage pulses having a voltage greater than 1 kV and with a negative sloping voltage between pulses as measured at an output of the pulsing power supply.

A pulsing power supply is disclosed that provides a waveform of voltage versus time having a plurality of high voltage pulses having a voltage greater than 1 kV and produces a negative sloping voltage during a portion of its output pulse that substantially offsets the voltage reduction on a wafer within a plasma chamber due to an ion current.

A pulse generator is disclosed. The pulse generator includes a DC source; a plurality of switches, a transformer; and a pulsing output. The pulse generator can be coupled with a plasma chamber. The pulsing output outputs high voltage pulses having a peak-to-peak voltage greater than 1 kV and a voltage portion between consecutive high voltage bipolar pulses that has a negative slope that substantially offsets the voltage reduction on a wafer within a plasma chamber due to an ion current. The resulting voltage at the wafer may be substantially flat between consecutive pulses.

DETAILED DESCRIPTION

Some embodiments include a power system (e.g., nanosecond pulser, pulse generator, etc.) that produces high voltage pulses and a voltage between two consecutive high voltage pulses has a negative slope.

The power system may be coupled with a plasma chamber. The magnitude of the negative slope, for example, may be substantially equal and opposite the ratio of an ion current produced within the plasma chamber and a chuck capacitance of the plasma chamber. The magnitude of the negative slope, for example, may substantially offset a voltage reduction on a wafer within the plasma chamber due to an ion current.

Power systems and/or plasma chamber, for example, may not be coupled with a traditional matching network.

The power system may include a snubber circuit that includes circuit elements that counteract an ion current within the plasma that occurs after a pulse has completed.

Figure 1:
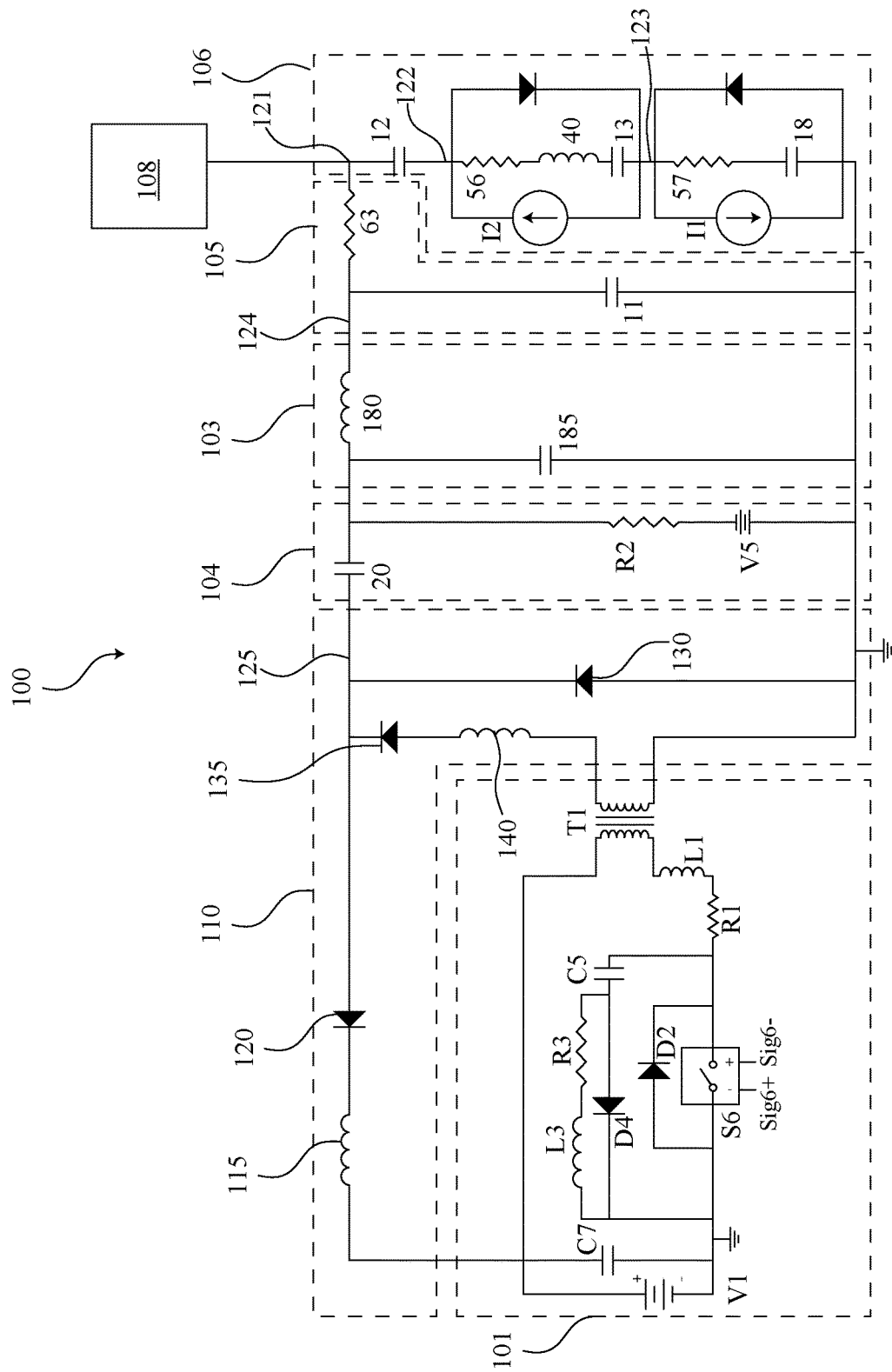
FIG. 1 is a circuit diagram of a power system driving a load stage according to some embodiments.

FIG. 1 is a circuit diagram of a pulser and plasma system 100 driving pulses into a plasma chamber 106 according to some embodiments. These pulses, for example, may comprise square wave pulses. The pulser stage 101 may produce a plurality of pulses that can be introduced into the plasma chamber 106. The RF generator 108 may produce RF signals such as, for example, sinusoidal signals. The filter circuit 103 may ensure that the RF signals and the pulses from interfering with one another. The values of the components in the snubber circuit, for example, snubber resistor R3, snubber inductor L3, and/or snubber capacitor C5 may be chosen to reduce droop in the pulses introduced into plasma chamber 106.

For example, the snubber resistor R3 may have a resistance less than about 100 mΩ such as, for example, 75, 50, 25, 10, 5, 1, 0.5 mΩ etc. Alternatively or additionally, the snubber resistor R3 may have a resistance of about 7.5 mΩ-1.25Ω. For example, the snubber capacitor may have a capacitance less than about 50 µF such as, for example, about 2 µF-35 µF.

In some embodiments, the plasma chamber 106 may represent an idealized or effective circuit for semiconductor processing chamber such as, for example, a plasma deposition system, semiconductor fabrication system, plasma sputtering system, etc. The capacitor 12, for example, may represent the capacitance of an electrostatic chuck upon which a semiconductor process wafer may sit. The chuck, for example, may comprise a dielectric material (e.g., aluminum oxide, or other ceramic materials and a conductor housed within the dielectric material). The chuck, for example, may have a capacitance less than about 20, 10, 5 nF, etc. For example, the capacitor 11 may have small capacitance (e.g., about 10 pF, 100 pF, 500 pF, 1 nF, 10 nF, 100 nF, etc.).

The capacitor 13, for example, may represent the sheath capacitance between the plasma to the wafer. The resistor 56, for example, may represent the sheath resistance between the plasma and the wafer. The inductor 40, for example, may represent the sheath inductance between the plasma and the wafer. The current source 12, for example, may be represent the ion current through the sheath. For example, the capacitor 11 or the capacitor 13 may have small capacitance (e.g., about 10 pF, 100 pF, 500 pF, 1 nF, 10 nF, 100 nF, etc.).

The capacitor 18, for example, may represent the plasma sheath capacitance to the wall of the chamber. The resistor 57, for example, may represent resistance between the plasma and the chamber wall. The current source I1, for example, may be representative of the ion current through a sheath and/or between the chamber wall and the plasma. For example, the capacitor 11 or the capacitor 18 may have small capacitance (e.g., about 10 pF, 100 pF, 500 pF, 1 nF, 10 nF, 100 nF, etc.).

In some embodiments, the plasma voltage may be the voltage measured from ground to circuit point 123; the wafer voltage is the voltage measured from ground to circuit point 122 and may represent the voltage at the surface of the wafer; the chucking voltage is the voltage measured from ground to circuit point 121; the electrode voltage (or the nanosecond pulser output voltage) is the voltage measure from ground to circuit point labeled 124 (e.g., on the electrode); and the input voltage is the voltage measured from ground to circuit point 125.

Figure 11:
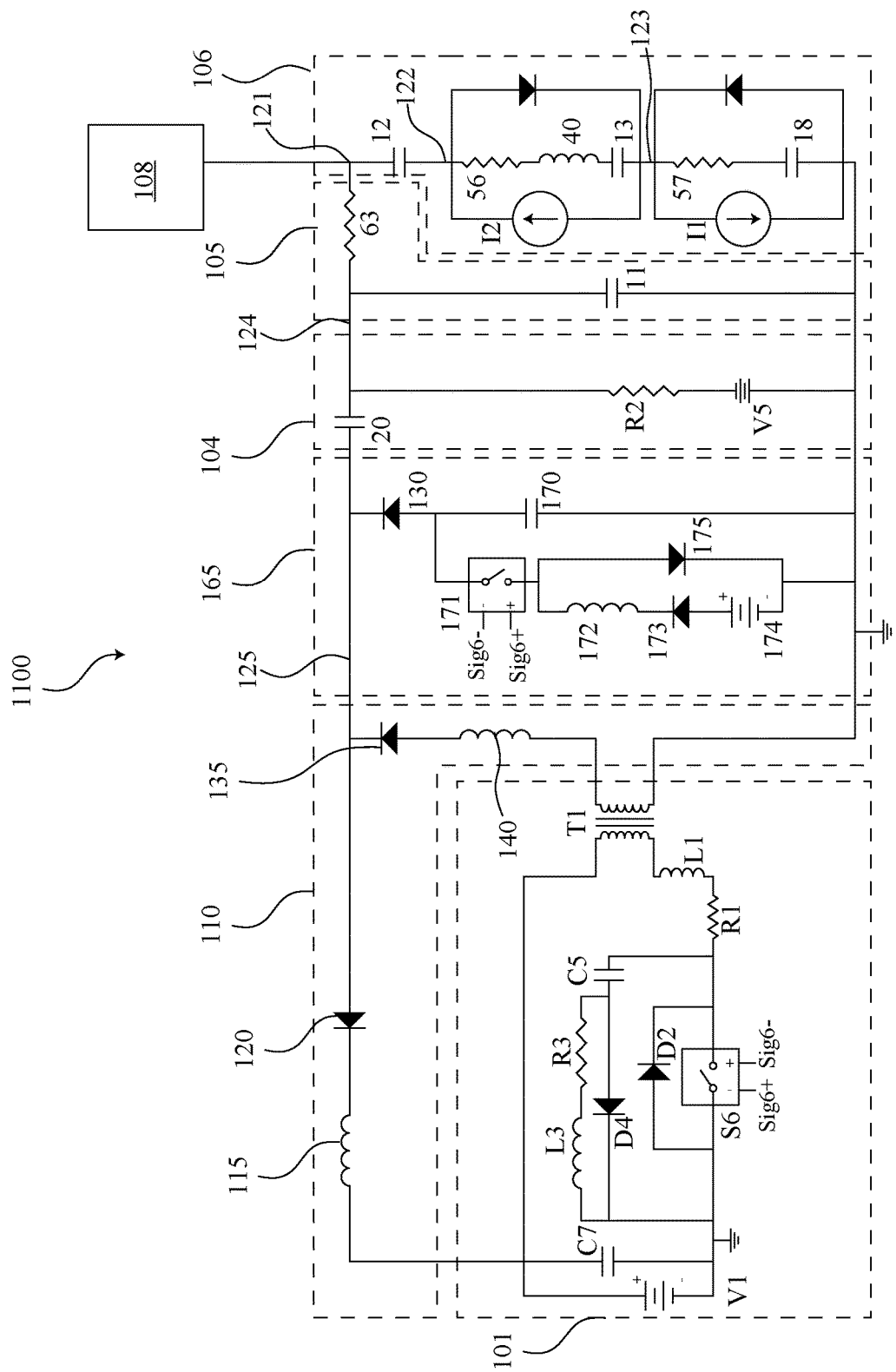
FIG. 11 is a circuit diagram of a power system with a droop compensation circuit driving a load circuit according to some embodiments.

In some embodiments, the pulser and plasma system 100 may include a DC bias circuit 104 as shown in FIG. 11.

In some embodiments, the bias capacitor 20 can isolate (or separate) the DC bias voltage from other circuit elements. The bias capacitor 20, for example, may allow for a potential shift from one portion of the circuit to another. In some embodiments, this potential shift may ensure that the electrostatic force holding the wafer in place on the chuck remains below the voltage threshold to prevent wafer breakage. The resistor R2 may isolate the DC bias supply from the high voltage pulsed output from the pulser stage 101.

The bias capacitor 20, for example, may have a capacitance less than about 100 pF, 10 pF, 1 pF, 100 µF, 10 µF 1 µF, etc. The resistor R2, for example, may have a high resistance such as, for example, a resistance of about 1 kΩ, 10 kΩ, 100 kΩ, 1 MΩ, 10 MΩ, 100 MΩ, etc.

Circuit 105 may represent the transmission lines from the circuit to the plasma chamber 106. The resistor 63, for example, may represent the resistance of the leads or transmission lines that connect from the output of the high voltage power system to the electrode (e.g., the plasma chamber 106). The capacitor 11, for example, may represent stray capacitance in the leads or transmissions line.

In some embodiments, the pulser stage 101 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the pulser stage 101 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the pulser stage 101 may include one or more nanosecond pulsers coupled together in any number of ways.

In some embodiments, the pulser stage 101 may include a DC source providing a consistent DC voltage that is switched by switch S6 and provides the switched power to the transformer T1. The DC source may include a voltage source V5 and an energy storage capacitor C7. If the transformer T1 has a 1:10 turn ratio, then the transformer may produce 10 kV on the load.

In some embodiments, if the load capacitance (e.g., capacitor 13 and capacitor 18) is small in comparison with the capacitance of the energy storage capacitor C7, voltage doubling may (or may not) occur at the transformer input or at the secondary of the transformer. For example, if the energy storage capacitor C7 provides 500 V, then 1 kV may be measured at the input of the transformer T1.

The switch S6, for example, may include one or more solid state switches such as, for example, an IGBT, a MOSFET, a SiC MOSFET, SiC junction transistor, FETs, SiC switches, GaN switches, photoconductive switch, etc. The switch S6 may be switched based on a signal from a controller labeled Sig6+ and Sig6−.

In some embodiments, the switch S6 may switch so fast that the switched voltage may never be at full voltage (e.g., the voltage of the energy storage capacitor C7 and/or the voltage source V1). In some embodiments, a gate resistor coupled with the switch S6 may be set with short turn on pulses.

In some embodiments, the pulser stage 101 may include a freewheeling diode D2. In some embodiments, the freewheeling diode D2 may be used in combination with inductive loads to ensure that energy stored in the inductive load may be allowed to dissipate after the switch S6 is opened by allowing current to keep flowing in the same direction through the inductor and energy is dissipated in the resistive elements of the circuit. If a freewheeling diode D2 is not included, then this can, for example, lead to a reverse voltage on the switch S6.

In some embodiments, the pulser stage 101 may include stray inductance L1 and/or stray resistance R1. The stray inductance L1, for example, may be less than about 10 nH, 100 nH, 1,000 nH, 10,000 nH, etc. The stray resistance R1, for example, may be less than about 1 Ω, 100 mΩ, 10 mΩ, etc.

In some embodiments, the energy recovery circuit 110 may be electrically coupled with the secondary side of the transformer and/or with the energy storage capacitor C7. The energy recovery circuit 110, for example, may include a crowbar diode 130 across the secondary side of the transformer T1. The energy recovery circuit 110, for example, may include energy recovery diode 120 and the energy recovery inductor 115 (arranged in series), which can allow current to flow from the secondary side of the transformer T1 to charge the energy storage capacitor C7. The energy recovery diode 120 and the energy recovery inductor 115 may be electrically connected with the secondary side of the transformer T1 and the energy storage capacitor C7. In some embodiments, the energy recovery circuit 110 may include the crowbar diode 130 and/or inductor 140 electrically coupled with the secondary of the transformer T1. The inductor 140 may represent the stray inductance and/or may include the stray inductance of the transformer T1.

In some embodiments, the energy recovery inductor 115 may include any type of inductor such as, for example, a ferrite core inductor or an air core inductor. In some embodiments, the energy recovery inductor 115 may have any type of geometry such as, for example, a solenoidal winding, a toroidal winding, etc. In some embodiments, the energy recovery inductor 115 may have an inductance greater then about 10 pH, 50 pH, 100 pH, 500 pH, etc. In some embodiments, the energy recovery inductor 115 may have an inductance of about 1 μH to about 100 mH.

In some embodiments, the order of the energy recovery inductor 115 and the energy recovery diode 120 may be interchanged. For instance, the energy recovery diode 120 may follow the energy recovery inductor 115 or the energy recovery inductor 115 may follow the energy recovery diode 120.

In some embodiments, when the nanosecond pulser is turned on, current may charge the plasma chamber 106 (e.g., charge the capacitor 13, capacitor 12, or capacitor 18). Some current, for example, may flow through energy recovery inductor 115 when the voltage on the secondary side of the transformer T1 rises above the charge voltage on the energy storage capacitor C7. When the nanosecond pulser is turned off, current may flow from the capacitors within the chamber (e.g., capacitor 11) through the energy recovery inductor 115 to charge the energy storage capacitor C7 until the voltage across the energy recovery inductor 115 is zero. The crowbar diode 130 may prevent voltage on the output of the NSP (e.g., at circuit point 124) from falling below ground and/or may provide a path for currents to continue to flow.

The energy recovery diode 120 may, for example, prevent charge from flowing from the energy storage capacitor C7 to the capacitors within the plasma chamber 106.

The value of energy recovery inductor 115 can be selected to control the current fall time. In some embodiments, the energy recovery inductor 115 can have an inductance value between 1 μH-600 μH. In some embodiments, the energy recovery inductor 115 can have an inductance value greater than 50 μH. In some embodiments, the energy recovery inductor 115 may have an inductance less than about 50 pH, 100 pH, 150 pH, 200 pH, 250 pH, 300 pH, 350 pH, 400 pH, 400 pH, 500 pH, etc.

For example, if the energy storage capacitor C7 provides 500 V, then 1 kV may be measured at the input of the transformer T1 (e.g., as noted above due to voltage doubling). The 1 kV at the transformer T1 may be divided among the components of the energy recovery circuit 110 when the switch S6 is open. If the values are chosen appropriately (e.g., snubber inductor L3 has an inductance less than the inductance of energy recovery inductor 115), the voltage across the energy recovery diode 120 and the energy recovery inductor 115 may be greater than 500 V. Current may then flow through energy recovery diode 120 and/or charge the energy storage capacitor C7. Current may also flow through diode D3 and inductor L8. Once the energy storage capacitor C7 is charged, the current may no longer flow through diode D3 and energy recovery inductor 115.

In some embodiments, the energy recovery circuit 110 may transfer energy (or transfer charge) from the plasma chamber 106, for example, on fast time scales (e.g., 1 ns, 10 ns, 50 ns, 100 ns, 250 ns, 500 ns, 1,000 ns, etc. time scales). The stray resistance of the energy recovery circuit may be low to ensure the pulse across the plasma chamber 106 has a fast fall time $t_f$. The stray resistance of the energy recovery circuit 110, for example, may have a resistance less than about 1 Ω, 100 mΩ, 10 mΩ, etc. In some embodiments, the energy transfer efficiency from the plasma chamber 106 may be high such as, for example, greater than about 60%, 70%, 80%, or 90%, etc.

Any number of components shown in FIG. 1 may or may not be required such as, for example, the diode 135 or the crowbar diode 130 or the inductor 140.

In some embodiments, a diode may be placed between the DC source V1 and the point where the energy recovery circuit 110 connects with the DC source V1 and/or the energy storage capacitor C7. This diode, for example, may be arranged to allow current to flow from the DC source V1 to the energy storage capacitor C7 but may not allow current to flow from the energy recovery circuit to the energy storage capacitor C7.

In some embodiments, the energy recovery circuit 110 may be removed. In some embodiments, a resistive output stage or a bias compensation circuit may be included. Various other circuits or circuit elements may be included.

In some embodiments, the pulser and plasma system 100 may include a filter circuit 103. In this example, the filter circuit includes a filter capacitor 185 and/or a filter inductor 180. The filter capacitor 185 may, for example, filter low frequency signals from the pulser stage 101. These low frequency signals, for example, may have frequencies (e.g., the majority of spectral content) of about 100 kHz and 10 MHz such as, for example, about 10 MHz. The filter capacitor 185, for example, may have values of about 1 pF to 1 nF such as, for example, less than about 100 pF.

In some embodiments, the filter inductor 180 may, for example, filter high frequency signals from the RF generator 108. These high frequency signals, for example, may have frequencies from about 1 MHz to 200 MHz such as, for example, greater than about 1 MHz or 10 MHz. The filter inductor 180, for example, may have values from about 10 nH to 10 μH such as, for example, greater than about 1 μH. In some embodiments, the filter inductor 180 may have a low coupling capacitance across it. In some embodiments, the coupling capacitance may be less than 1 nF.

In some embodiments, either or both the filter capacitor 185 and the filter inductor 180 may isolate the pulses produce by the RF generator 108 from the pulses produce by the pulser stage 101 (or vice versa). For example, the filter capacitor 185 may isolate the pulses produced by the pulser stage 101 from the pulses produced by the RF generator 108. The filter inductor 180 may isolate the pulses produced by the RF generator 108 from the pulses produced by the pulser stage 101.

Figure 2:
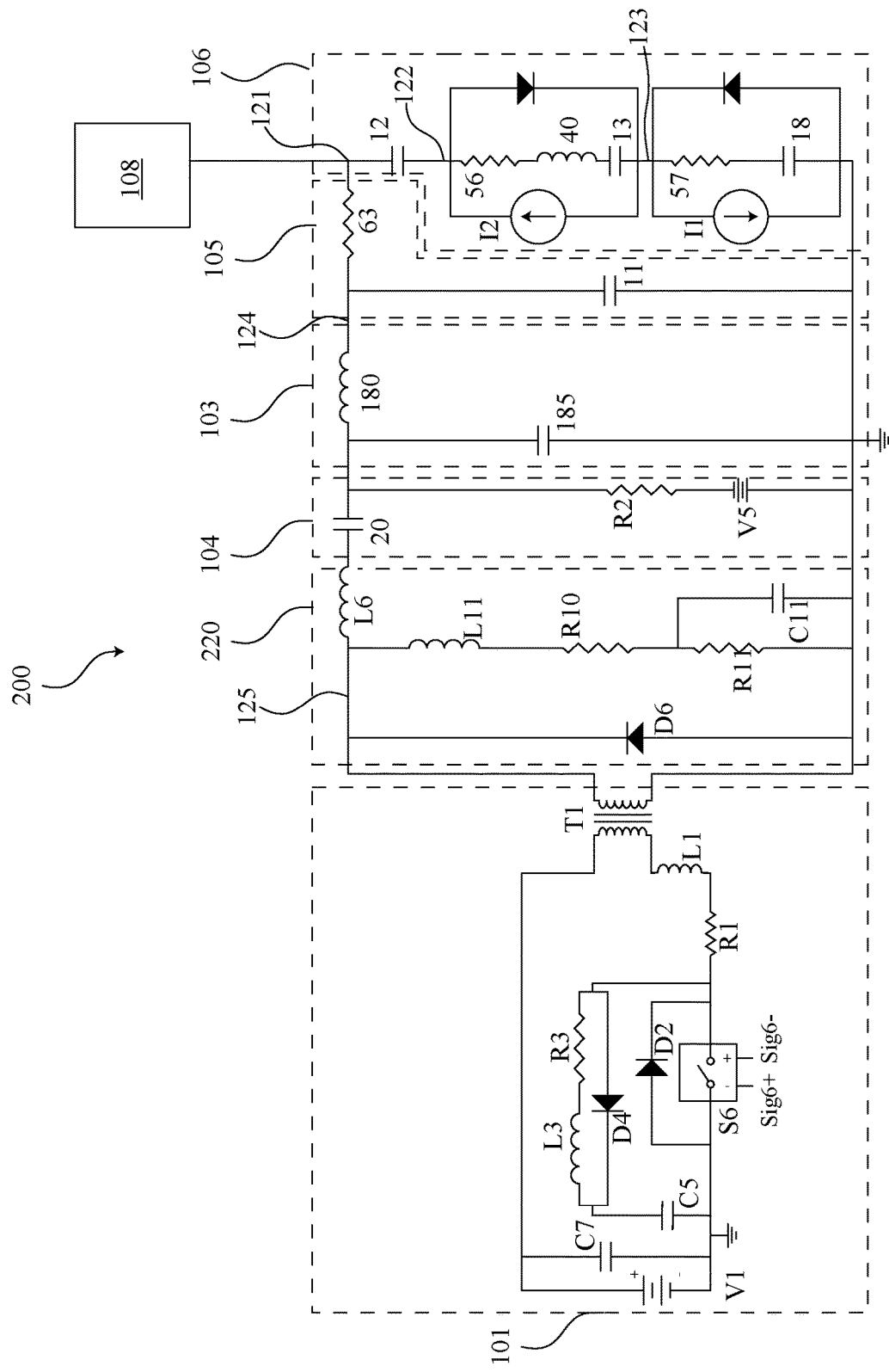
FIG. 2 is a circuit diagram of a power system with a resistive output stage driving a load stage according to some embodiments.

FIG. 2 is a circuit diagram of a power system 200 with a resistive output stage 220 driving a load stage according to some embodiments. In this example, the energy recovery circuit 110 is removed from the pulser and plasma system 100 and is replaced by the resistive output stage 220.

The resistive output stage 220 may include any resistive output stage known in the art. For example, the resistive output stage 220 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes.

For example, the resistive output stage 220 may include an inductor L11, resistor R10, resistor R11, and capacitor C11. In some embodiments, inductor L11 may include an inductance of about 5 μH to about 25 μH. In some embodiments, the resistor R11 may include a resistance of about 50 Ω to about 250Ω. In some embodiments, the resistor R10 may comprise the stray resistance in the resistive output stage 220.

In some embodiments, the resistor R11 may include a plurality of resistors arranged in series and/or parallel. The capacitor C11 may represent the stray capacitance of the resistor R11 including the capacitance of the arrangement series and/or parallel resistors. The capacitance of stray capacitance C11, for example, may be less than 500 pF, 250 pF, 100 pF, 50 pF, 10 pF, 1 pF, etc. The capacitance of stray capacitance C11, for example, may be less than the load capacitance such as, for example, less than the capacitance of 12, 13, and/or 18.

In some embodiments, the resistor R11 may discharge the load (e.g., a plasma sheath capacitance). In some embodiments, the resistive output stage 220 may be configured to discharge over about 1 kilowatt of average power during each pulse cycle and/or a joule or less of energy in each pulse cycle. In some embodiments, the resistance of the resistor R11 in the resistive output stage 220 may be less than 200Ω. In some embodiments, the resistor R11 may comprise a plurality of resistors arranged in series or parallel having a combined capacitance less than about 200 pF (e.g., 111).

In some embodiments, the resistive output stage 220 may include a collection of circuit elements that can be used to control the shape of a voltage waveform on a load. In some embodiments, the resistive output stage 220 may include passive elements only (e.g., resistors, capacitors, inductors, etc.). In some embodiments, the resistive output stage 220 may include active circuit elements (e.g., switches) as well as passive circuit elements. In some embodiments, the resistive output stage 220, for example, can be used to control the voltage rise time of a waveform and/or the voltage fall time of waveform.

In some embodiments, the resistive output stage 220 can discharge capacitive loads (e.g., a wafer and/or a plasma). For example, these capacitive loads may have small capacitance (e.g., about 10 pF, 100 pF, 500 pF, 1 nF, 10 nF, 100 nF, etc.).

In some embodiments, a resistive output stage 220 can be used in circuits with pulses having a high pulse voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.) and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage 220 may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 220 may include a series or parallel network of passive components. For example, the resistive output stage 220 may include a series of a resistor, a capacitor, and an inductor. As another example, the resistive output stage 220 may include a capacitor in parallel with an inductor and the capacitor-inductor combination in series with a resistor. For example, L11 can be chosen large enough so that there is no significant energy injected into the resistive output stage 220 when there is voltage out of the rectifier. The values of R10 and R11 can be chosen so that the L/R time can drain the appropriate capacitors in the load faster than the RF frequency.

In some embodiments, the pulser stage 101 of either pulser and plasma system 100 or power system 200 may include a snubber circuit. In some embodiments, the snubber circuit may include a snubber capacitor C5. In some embodiments, the snubber circuit may include a snubber capacitor C5 and a snubber resistor R3. In some embodiments, the snubber circuit may include a snubber capacitor C5, a snubber inductor L3, and a snubber resistor R3

In some embodiments, the snubber circuit may include snubber resistor R3 and/or the snubber inductor L3 may be arranged in a parallel circuit with snubber diode D4. The arrangement of the snubber inductor L3 and the snubber resistor R3 and the snubber diode D4 may be arranged in series with snubber capacitor C5. In some embodiments, the snubber resistor R3 and/or the snubber diode D4 may be placed between the collector of switch S6 and the primary winding of the transformer T1. The snubber diode D4 may be used to snub out any over voltages in the switching. A large and/or fast snubber capacitor C5 may be coupled on either the emitter side or the collector side of the switch S6. The freewheeling diode D2 may also be coupled with the emitter side of the switch S1. Various other components may be included that are not shown in the figures. One or more switches and or circuits can be arranged in parallel or series.

In some embodiments, to combat ion current within a chamber, a positive current can be made to flow out of the pulser stage 101 after a pulse has concluded. This may be accomplished, for example, by adjusting the inductance of the snubber inductor L3 (which may, for example, be removed), the resistance of the snubber resistor R3 and/or the capacitance of the snubber capacitor C5 values such that the snubber capacitor C5 can discharge during a pulse and/or may not be fully charged before the next pulse. This may, for example, allow for a decaying current to flow out of the energy storage capacitor C7 and/or DC source V1 in the same direction as current flows during a pulse. This may produce a waveform shape on the wafer that does not include a droop between pulses within the plasma chamber.

A droop may manifest itself as voltage rising between pulses produced by the pulser stage 101. A droop may include of voltage rising by 0.2 V/ns (e.g., for a chuck with about a 5 nF capacitance and an ion current of 1 Amp) or 1 V/ns (e.g., for a chuck with about a 5 nF capacitance and an ion current of 5 Amp).

Droop compensation, on the other hand, may include a negative voltage slope between positive going pulses produced by the pulser stage 101, which may cancel the droop voltage caused by ion flux to the wafer within the vapor chamber. Droop compensation, for example, may include a voltage slope of about 0.2 V/ns (e.g., for a chuck with about a 5 nF capacitance and an ion current of 1 Amp) or by about 1 V/ns (e.g., for a chuck with about a 5 nF capacitance and an ion current of 5 Amp) between pulses. As another example, droop compensation, may include a negative voltage slope by more than about 100,000, 10,000, 1,000, or 100 kV/s between positive going pulses.

An RF generator 108 may be electrically coupled with the plasma chamber 106. The RF generator 108 may introduce, for example, high frequency RF signals into the plasma chamber, which may create a plasma from constituents within the chamber.

The RF generator 108 may include any type of device that generates RF power that is applied to a cathode. The RF generator 108, for example, may include a nanosecond pulser, a resonant system driven by a half bridge or full bridge circuit, an RF amplifier, a non-linear transmission line, an RF plasma generator, etc. In some embodiments, the RF generator 108 may include an impedance matching network.

In some embodiments, the RF generator 108 may include one or more RF drivers that may generate an RF power signal having a plurality of different RF frequencies such as, for example, 2 MHz, 13.56 MHz, 27 MHz, 60 MHz, and 80 MHz. Typical RF frequencies, for example, may include frequencies between 200 kHz and 800 MHz In some embodiments, the RF generator 108 may create and sustain a plasma within the plasma chamber. The RF generator 108, for example, provides an RF signal to a cathode (and/or an antenna) to excite the various gases and/or ions within the chamber to create the plasma.

In some embodiments, the RF generator 108 may be coupled with or may include an impedance matching circuit, which may match the non-standard output impedance of the RF generator 108 to the industry standard characteristic impedance of the coaxial cable of 50 Ωs or any cable.

In some embodiments, the RF generator 108 may produce burst with an RF frequency greater than the pulse repetition frequency of the pulses produced by the pulser stage 101.

In some embodiments, the pulser and plasma system 100 may include a filter capacitor 185 and/or a filter inductor 180. The filter capacitor 185 may, for example, filter low frequency signals from the pulser stage 101. These low frequency signals, for example, may have frequencies (e.g., the majority of spectral content) of about 100 kHz and 10 MHz such as, for example, about 10 MHz. The filter capacitor 185, for example, may have values of about 1 pF to 1 nF such as, for example, less than about 100 pF.

In some embodiments, the filter inductor 180 may, for example, filter high frequency signals from the RF generator 108. These high frequency signals, for example, may have frequencies from about 1 MHz to 200 MHz such as, for example, greater than about 1 MHz or 10 MHz. The filter inductor 180, for example, may have values from about 10 nH to 10 µH such as, for example, greater than about 1 µH. In some embodiments, the filter inductor 180 may have a low coupling capacitance across it. In some embodiments, the coupling capacitance may be less than 1 nF.

In some embodiments, either or both the filter capacitor 185 and the filter inductor 180 may isolate the pulses produce by the RF generator 108 from the pulses produce by the pulser stage 101 (or vice versa). For example, the filter capacitor 185 may isolate the pulses produced by the pulser stage 101 from the pulses produced by the RF generator 108. The filter inductor 180 may isolate the pulses produced by the RF generator 108 from the pulses produced by the pulser stage 101.

Figure 3:
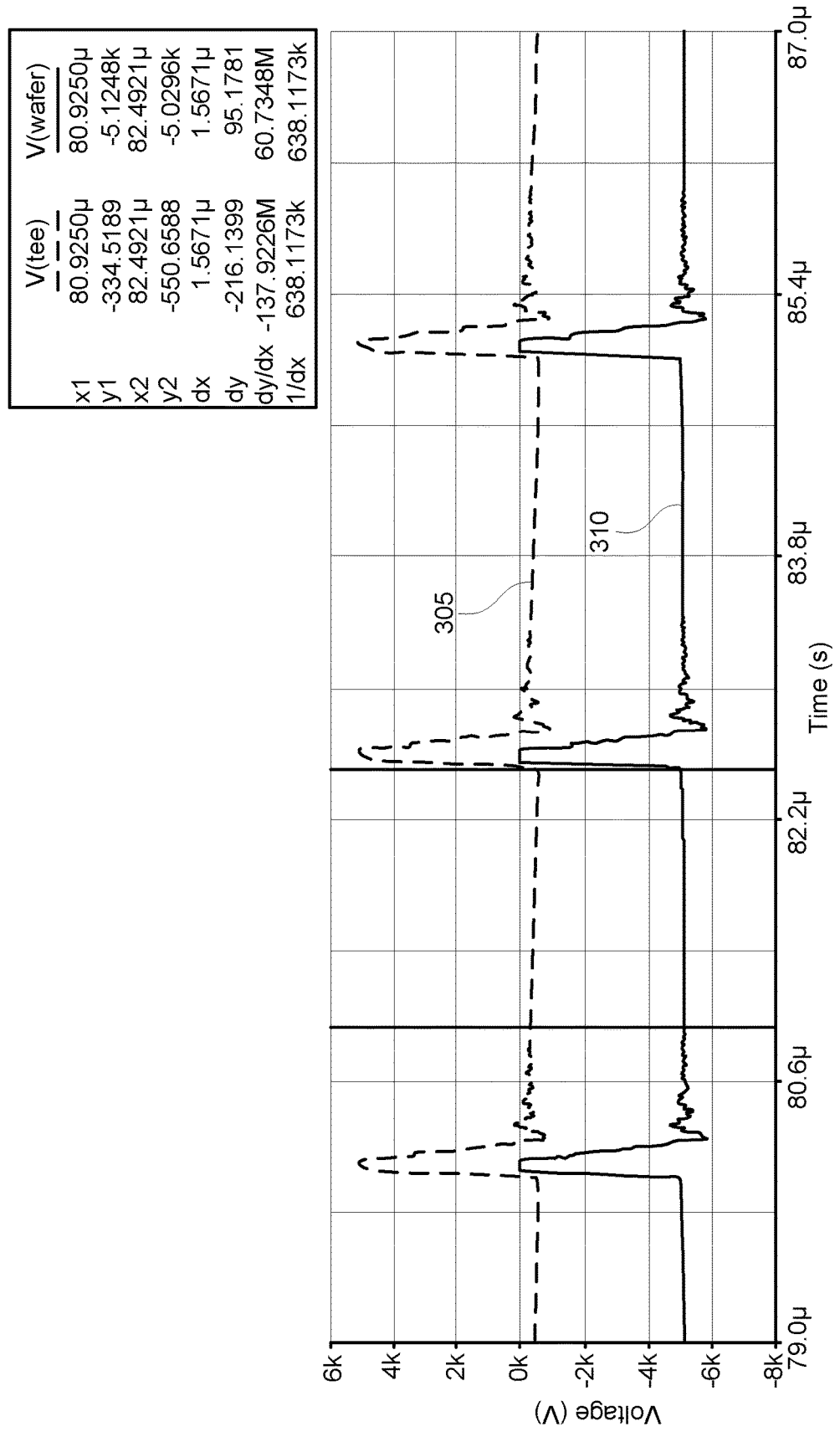
FIG. 3 is an example of two waveforms produced by the power system without RF power according to some embodiments.

FIG. 3 is an example of two waveforms produced by the power system without RF power (e.g., without an RF signal from RF generator 108) according to some embodiments. In this example, the chuck waveform 305 is the chucking voltage (e.g., circuit point 121) and wafer waveform 310 is the voltage measured on the wafer (e.g., circuit point 122). In this example, the resistance of snubber resistor R3 is 75 mΩ, the capacitance of snubber capacitor C5 is 12 µF, the pulse width is 100 ns, and the inductance of filter inductor

180, for example, may be about 100 nH. The DC voltage provided by DC source V1 is 500 V. As shown in the figure, the wafer waveform 310 is largely flat between pulses. For instance, between pulses the wafer waveform 810 has a slope that is less than 1 V/ns, 0.5 V/ns, 0.2 V/ns, 0.1 V/ns, etc.

Figure 4:
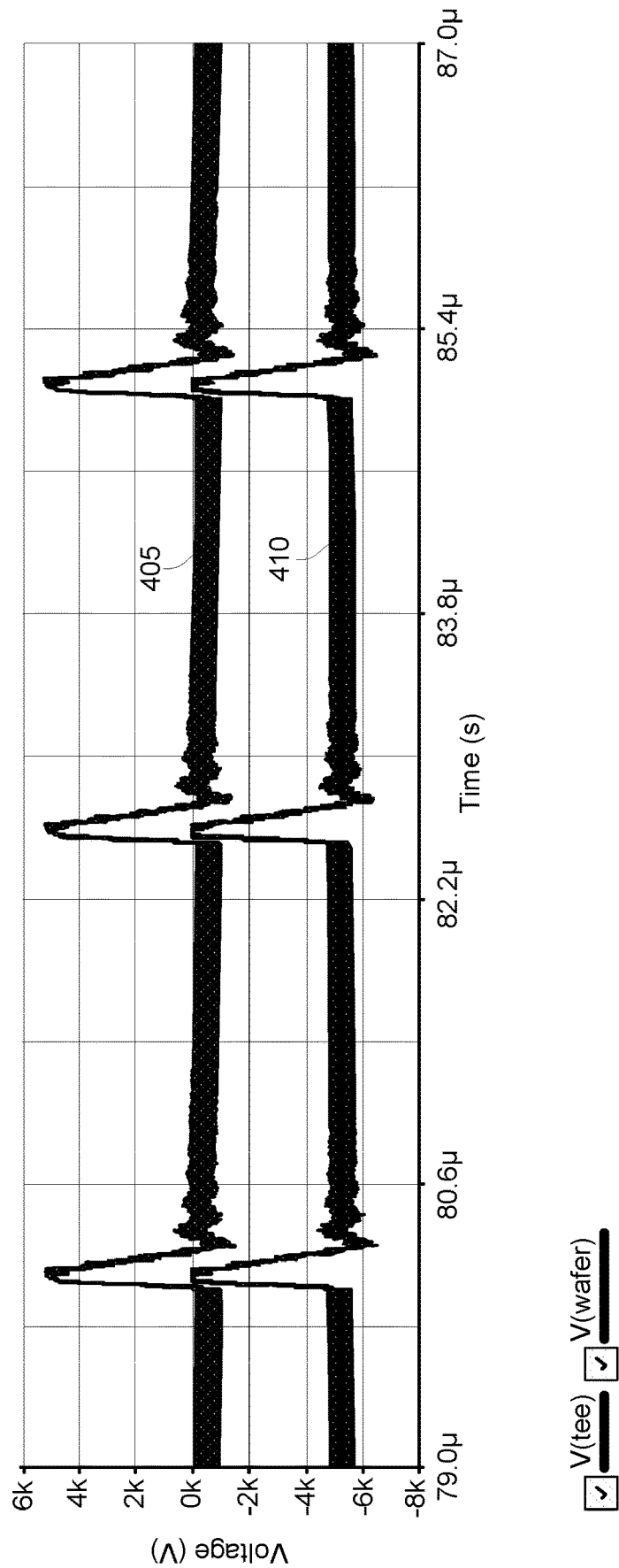
FIG. 4 is an example of two waveforms produced by the power system with RF power according to some embodiments.

FIG. 4 is an example of two waveforms produced by the power system with RF (e.g., with an RF signal from RF generator 108) power according to some embodiments. In this example, the chuck waveform 405 is the chucking voltage (e.g., circuit point 121) and wafer waveform 410 is the voltage measured on the wafer (e.g., circuit point 122). In this example, the resistance of snubber resistor R3 is 75 mΩ, the capacitance of snubber capacitor C5 is 12 μF, the pulse width is 100 ns, and the inductance of filter inductor 180 is 100 nH. The DC voltage provided by DC source V1 is 500 V. As shown in the figure, the wafer waveform 410 is substantially flat between pulses. The wafer waveform 410, for example, may vary by less consecutive pulses changes less than 1 V/ns between consecutive pulses.

Figure 5:
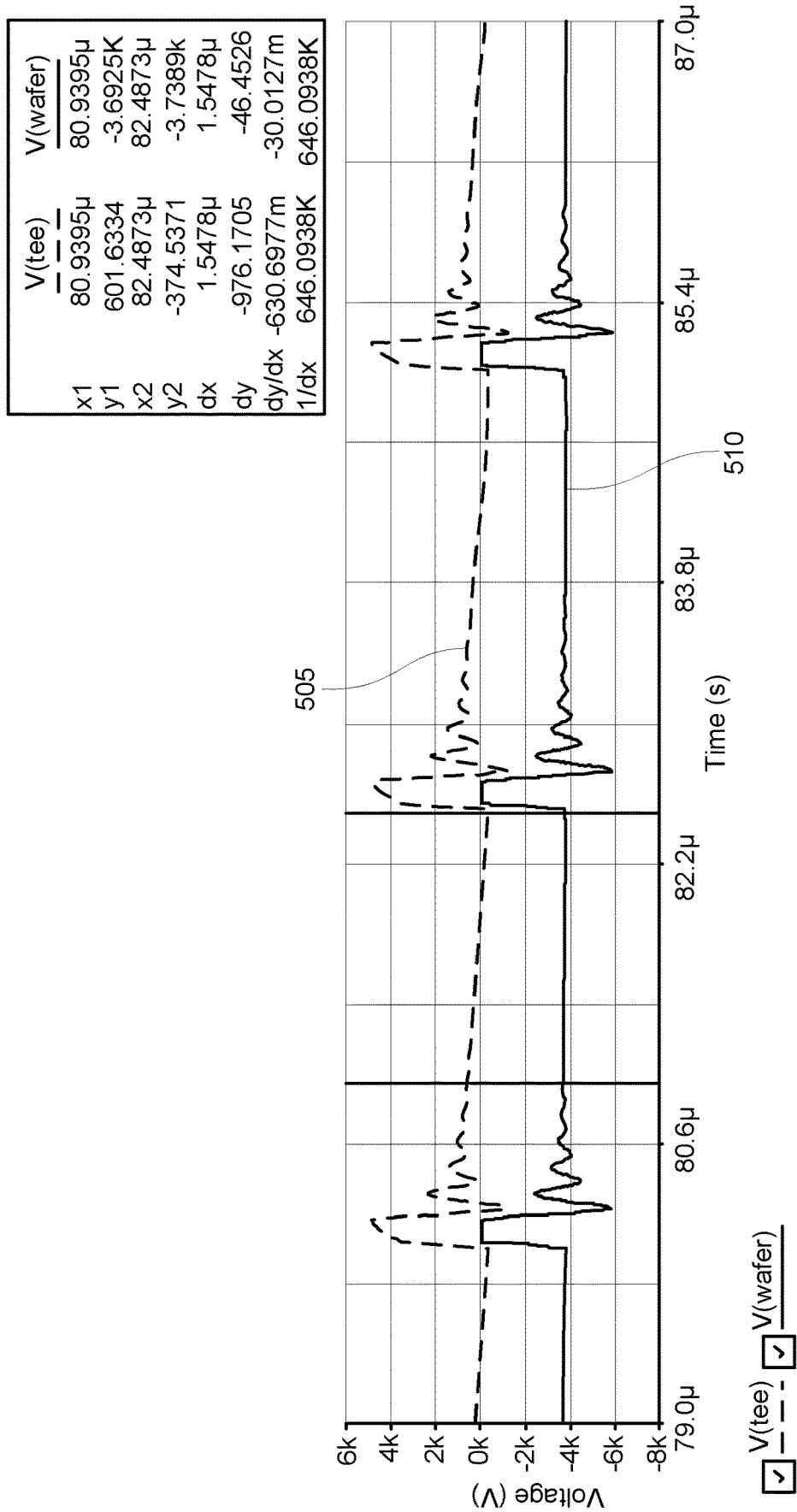
FIG. 5 is an example of two waveforms produced by the power system without RF power according to some embodiments.

FIG. 5 is an example of two waveforms produced by the power system without RF power (e.g., without an RF signal from RF generator 108) according to some embodiments. In this example, the chuck waveform 505 is the chucking voltage (e.g., circuit point 121) and wafer waveform 510 is the voltage measured on the wafer (e.g., circuit point 122). In this example, the resistance of snubber resistor R3 is 10 mΩ, the capacitance of snubber capacitor C5 is 35 μF, the pulse width is 150 ns, and the inductance of filter inductor 180 is 0 nH. The DC voltage provided by DC source V1 is 750 V. As shown in the figure, the wafer waveform 510 is largely flat between pulses. For instance, between pulses the wafer waveform 510 has a slope that is less than 1 V/ns, 0.5 V/ns, 0.2 V/ns, 0.1 V/ns, etc.

Figure 6:
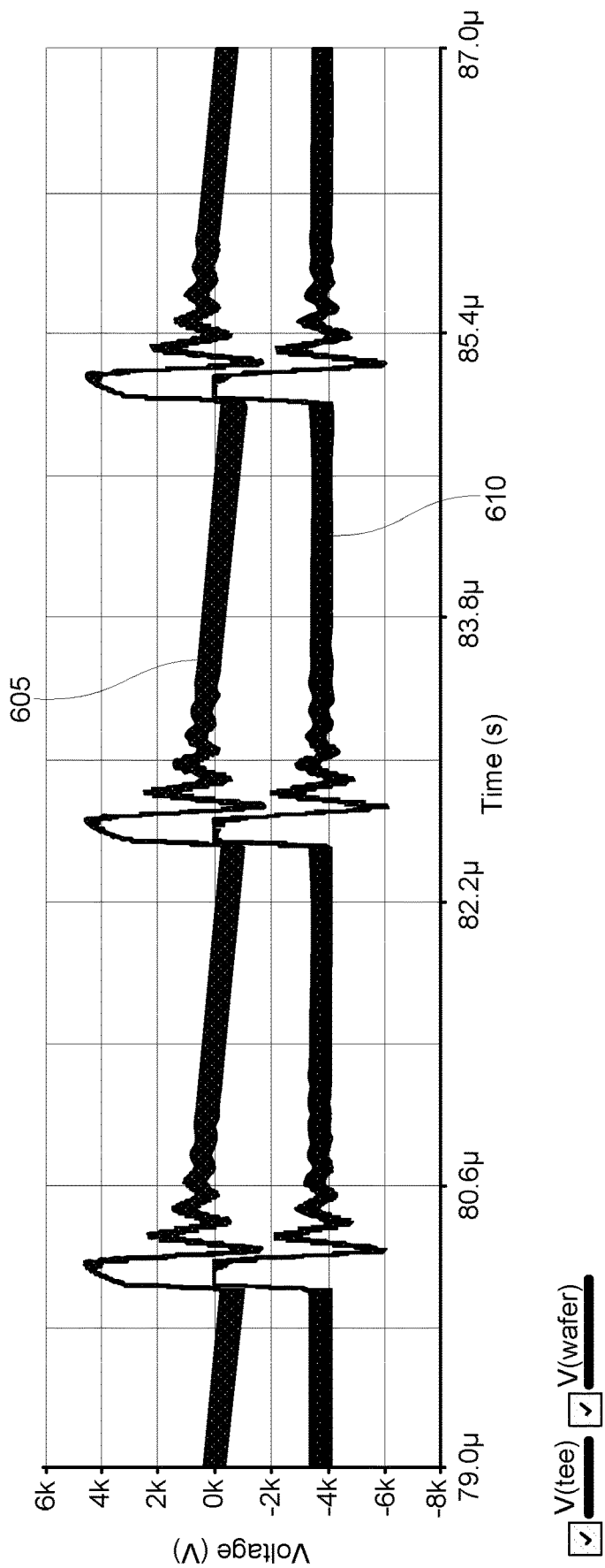
FIG. 6 is an example of two waveforms produced by the power system with RF power according to some embodiments.

FIG. 6 is an example of two waveforms produced by the power system with RF (e.g., with an RF signal from RF generator 108) power according to some embodiments. In this example, the chuck waveform 605 is the chucking voltage (e.g., circuit point 121) and wafer waveform 610 is the voltage measured on the wafer (e.g., circuit point 122). In this example, the resistance of snubber resistor R3 is 10 mΩ, the capacitance of snubber capacitor C5 is 35 μF, the pulse width is 150 ns, and the inductance of filter inductor 180 is 0 nH. The DC voltage provided by DC source V1 is 750 V. As shown in the figure, the wafer waveform 610 is substantially flat between pulses. For instance, between pulses the wafer waveform 610 has a slope that is less than 1 V/ns, 0.5 V/ns, 0.2 V/ns, 0.1 V/ns, etc.

Figure 7:
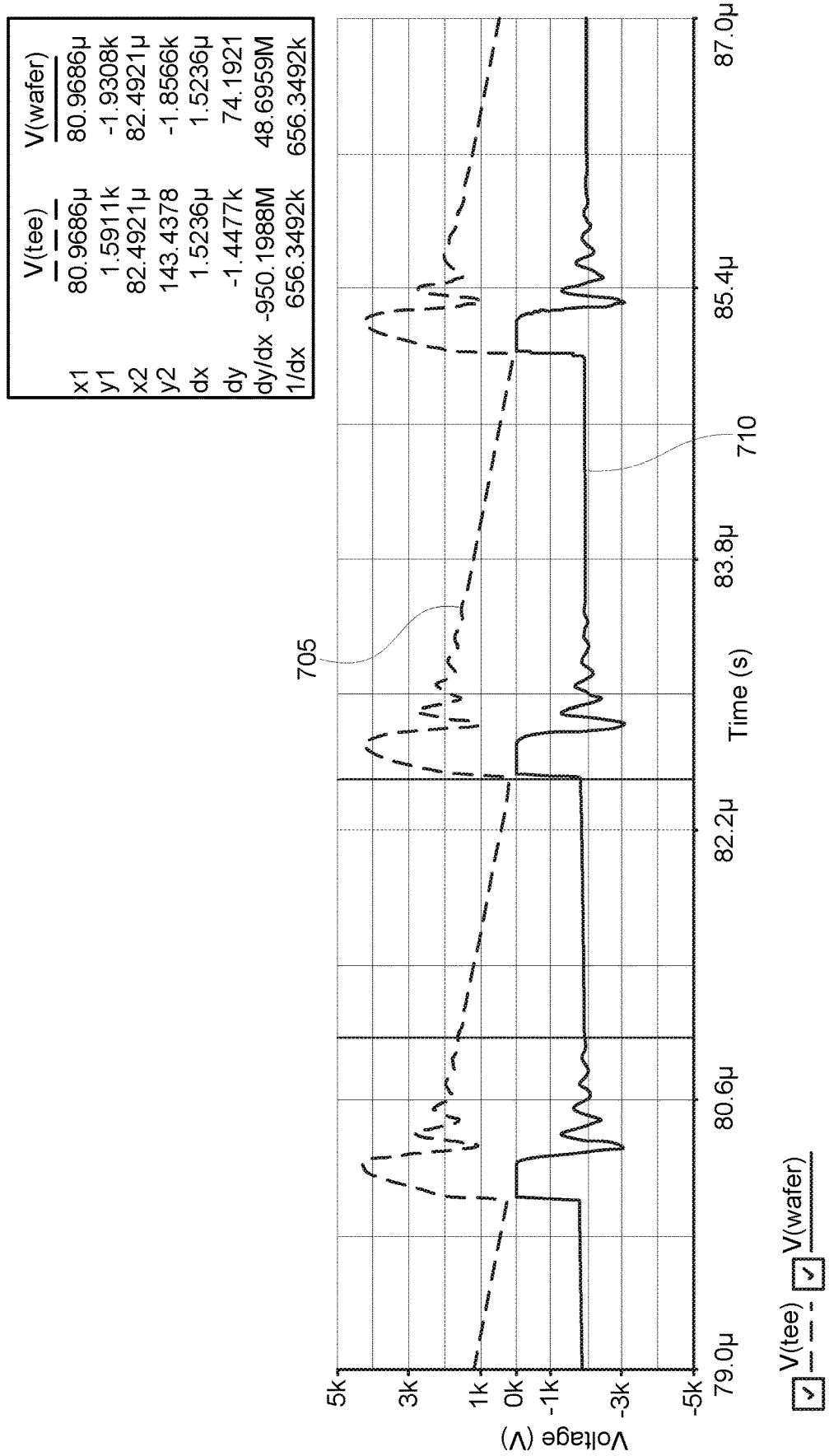
FIG. 7 is an example of two waveforms produced by the power system without RF power according to some embodiments.

FIG. 7 is an example of two waveforms produced by the power system without RF power (e.g., without an RF signal from RF generator 108) according to some embodiments. In this example, the chuck waveform 705 is the chucking voltage (e.g., circuit point 121) and wafer waveform 710 is the voltage measured on the wafer (e.g., circuit point 122). In this example, the resistance of snubber resistor R3 is 10Ω, the capacitance of snubber capacitor C5 is 35 μF, the pulse width is 250 ns, and the inductance of filter inductor 180 is 0 nH. The DC voltage provided by DC source V1 is 700 V. As shown in the figure, the wafer waveform 710 is largely flat between pulses. For instance, between pulses the wafer waveform 710 has a slope that is less than 1 V/ns, 0.5 V/ns, 0.2 V/ns, 0.1 V/ns, etc.

Figure 8:
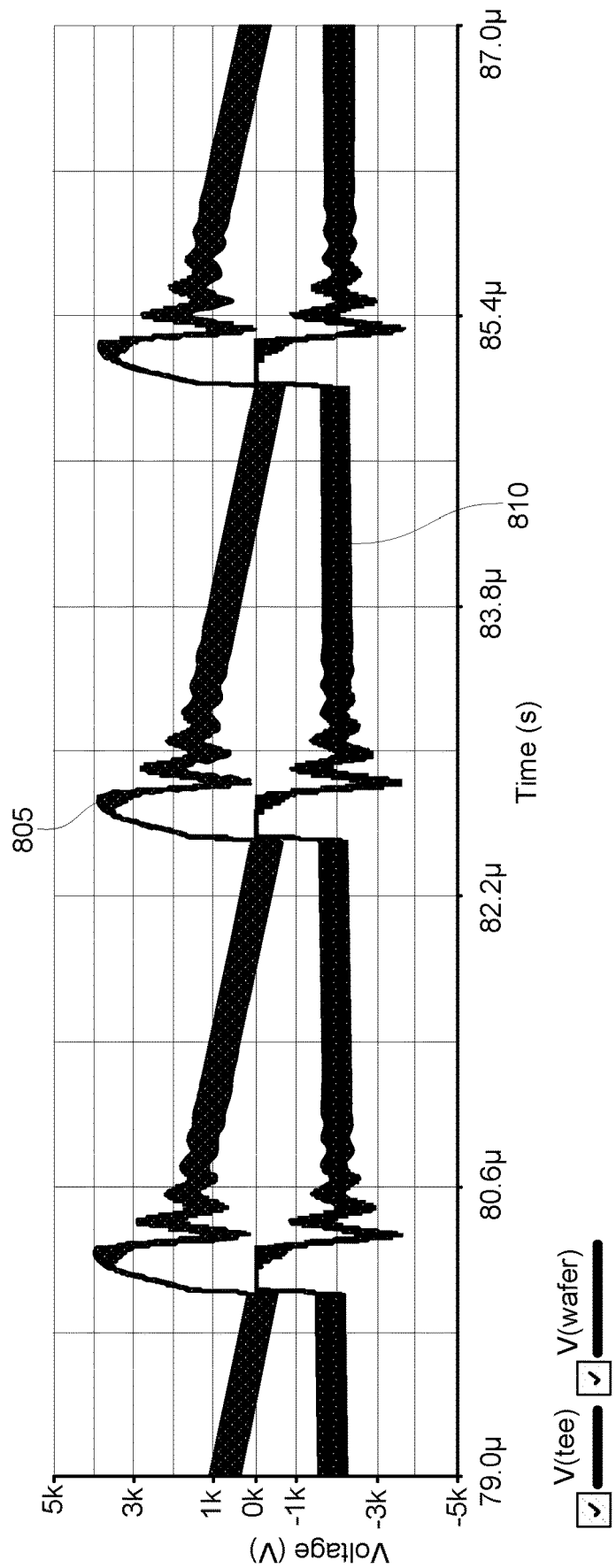
FIG. 8 is an example of two waveforms produced by the power system with RF power according to some embodiments.

FIG. 8 is an example of two waveforms produced by the power system with RF (e.g., with an RF signal from RF generator 108) power according to some embodiments. In this example, the chuck waveform 805 is the chucking voltage (e.g., circuit point 121) and wafer waveform 810 is the voltage measured on the wafer or at a point within the plasma chamber (e.g., circuit point 122).

In this example, the resistance of snubber resistor R3 is 10Ω, the capacitance of snubber capacitor C5 is 35 μF, the pulse width is 250 ns, and the inductance of filter inductor 180 is 0 nH. The DC voltage provided by DC source V1 is 800 V.

As shown in FIG. 8, the chuck waveform (or the output voltage from the pulser) has a negative slope between consecutive pulses. This negative slope, for example, can compensate for a voltage reduction on a wafer within the plasma chamber due to an ion current. This negative slope, for example, can have a magnitude that is substantially equal and opposite the ratio of an ion current produced within the plasma chamber and a chuck capacitance of the plasma chamber.

As shown in FIG. 8, the wafer waveform 810 is substantially flat between consecutive pulses. For instance, between consecutive pulses, the wafer waveform 810 has a slope that is less than 1 V/ns, 0.5 V/ns, 0.2 V/ns, 0.1 V/ns, etc.

Figure 9:
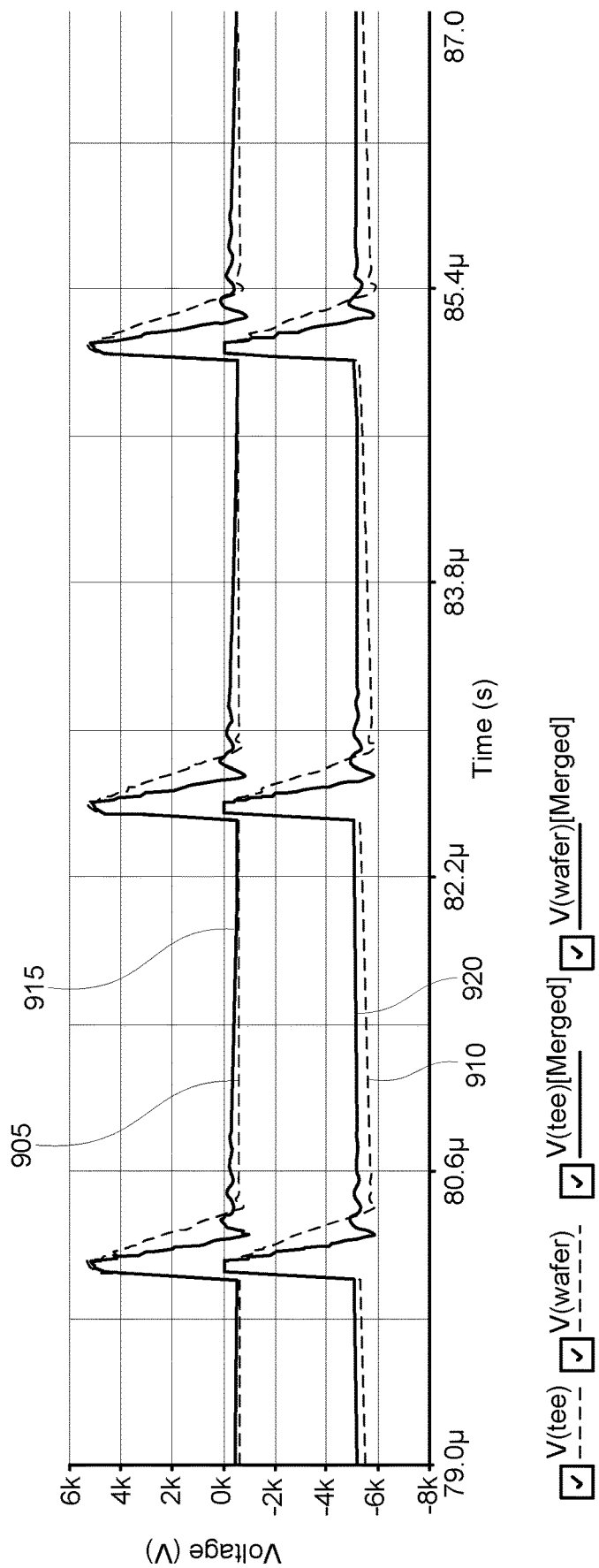
FIG. 9 is an example of side-by-side waveforms with and without droop compensation produced by the nanosecond pulser without system according to some embodiments.

FIG. 9 is an example of side-by-side waveforms with and without droop compensation produced by the nanosecond pulser without system according to some embodiments. In this example, the chuck waveform 905 is the chucking voltage without droop compensation and chucking waveform 915 is the chucking voltage with droop compensation. In this example, the wafer waveform 910 is the wafer voltage without droop compensation and wafer waveform 920 is the wafer voltage with droop compensation. In this example, without droop compensation the resistance of snubber resistor R3 is 1.25Ω, the capacitance of snubber capacitor C5 is 2 μF, and with droop compensation the snubber resistor R3 is lowered to 75Ω, the capacitance of snubber capacitor C5 is 12 μF.

As shown in FIG. 9, the chucking waveform 915 (or the output voltage from the pulser) has a negative slope between consecutive pulses. This negative slope, for example, can compensate for a voltage reduction on a wafer within the plasma chamber due to an ion current. This negative slope, for example, can have a magnitude that is substantially equal and opposite the ratio of an ion current produced within the plasma chamber and a chuck capacitance of the plasma chamber.

As shown in FIG. 9, the wafer waveform 920 is substantially flat between consecutive pulses. For instance, between consecutive pulses, the wafer waveform 810 has a slope that is less than 1 V/ns, 0.5 V/ns, 0.2 V/ns, 0.1 V/ns, etc.

Figure 10A:
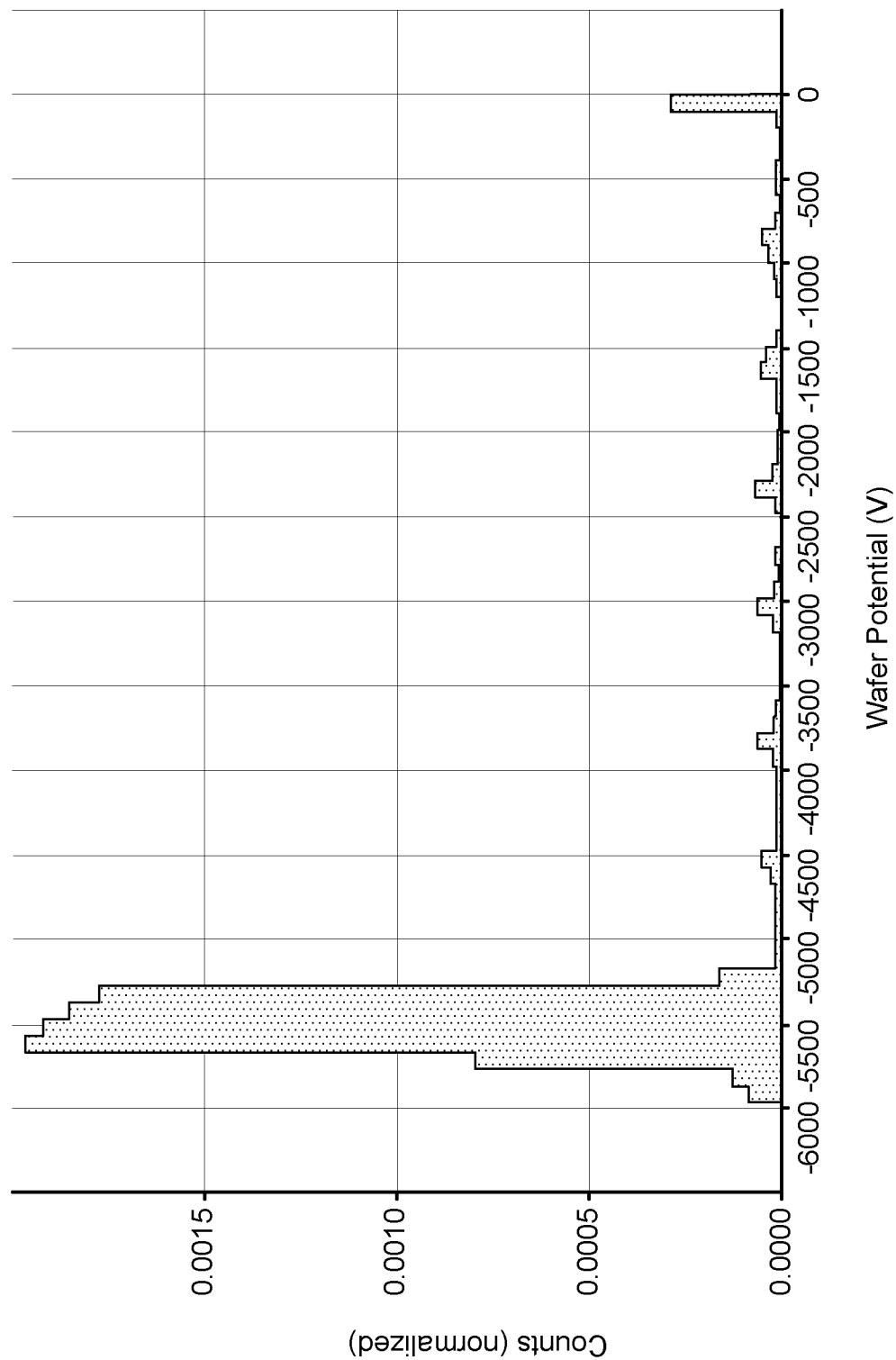
FIG. 10A and FIG. 10B are histograms of the voltage within a plasma chamber without and with droop correction according to some embodiments.
Figure 10B:
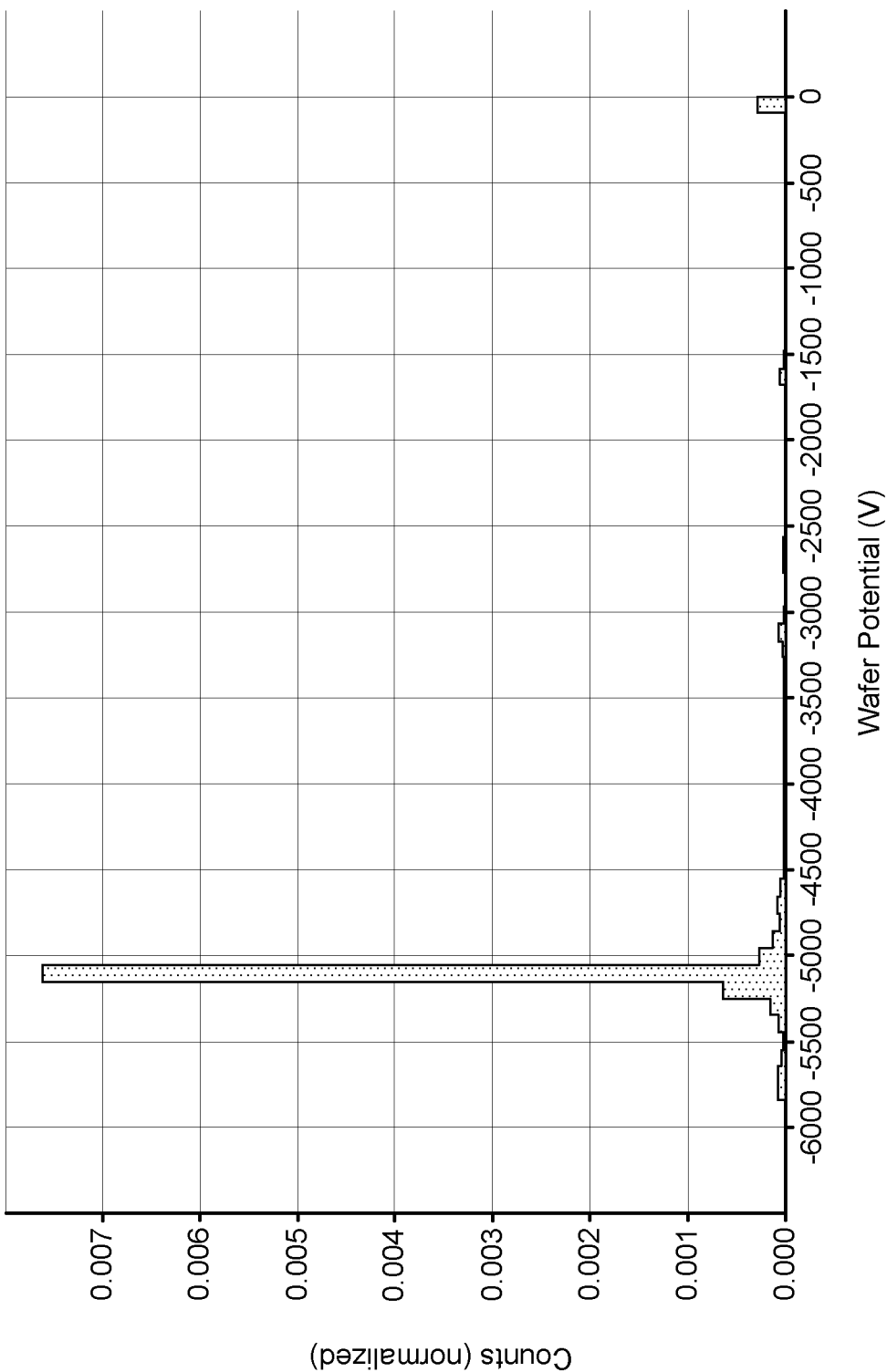

FIG. 10A is histograms of the wafer potential without droop correction according to some embodiments. FIG. 10B is histograms of the wafer potential with droop correction according to some embodiments.

FIG. 11 is a circuit diagram of a power system 1100 with a droop compensation circuit 165 driving a plasma chamber 106 according to some embodiments. In some embodiments, the droop compensation circuit 165 may include a crowbar diode 130 and a droop capacitor 170. The droop capacitor 170 may have a capacitor of about 1 nF to about 100 nF. In this example, with the addition of the droop capacitor 170 the current that flows through the crowbar diode 130 and the energy recovery circuit 110 may induce a change in voltage across the droop capacitor 170 which may counteract any droop. The droop capacitor 170 can restrict the flow of current until the droop capacitor 170 is charged eliminating the drop. The switch 171 can be used to drain charge from the droop capacitor 170 to ground during pulses. The switch 171, can be switched with the same switching frequency and/or period as the switch 171 such as, for example, using the same signal. For instance, when the switch 171 is closed, the pulser stage 101 pulses, and the switch 171 is closed draining the droop capacitor 170.

In some embodiments, the DC power supply 174 may allow for a DC offset or bias, if needed. In some embodiments, the DC power supply 174 may also be charged when charge is drained from the droop capacitor 170.

In some embodiments, the inductor 172 may be a current limiting inductor. The inductor 172, for example, may have an inductance of about 10 nH to about 500 nH. The diode 173 and/or diode 175 may be a crowbar diode. Diode 175, for example, may allow current to flow when the switch 171 is open and may allow voltage spikes to flow to ground.

In some embodiments, the inductor 172, the diode 173 and/or the diode 175 may be replaced with a resistor.

The switch 171 may include any type of switch that can switch high voltages at high frequencies. In some embodiments, the switch 171 comprises a high voltage switch described in U.S. Patent Application No. 62/717,637, titled "HIGH VOLTAGE SWITCH FOR NANOSECOND PULSING," and/or in U.S. patent application Ser. No. 16/178,565, titled "HIGH VOLTAGE SWITCH FOR NANOSECOND PULSING," which is incorporated into this disclosure in its entirety for all purposes.

In some embodiments, the energy recovery circuit 110 may be removed or replaced with a primary sink circuit and/or a resistive output stage. In some embodiments, the energy recovery circuit 110 may be connected to ground after the energy recovery inductor 115.

In this example, the DC bias circuit 104 does not include any bias compensation. The DC bias circuit 104 includes an offset supply voltage V5 that may, for example, bias the output voltage either positively or negatively. In some embodiments, the offset supply voltage V5, can be adjusted to change the potential between the wafer voltage and the chuck voltage. In some embodiments, offset supply voltage V5 can have a voltage of about ±5 kV, ±4 kV, ±3 kV, ±2, kV, ±1 kV, etc. kV. The DC bias circuit 104 may or may not be included in the power system 1100.

The power system 1100 may include an RF generator 108 and filter inductor 180 The filter inductor 180, for example, may filter high frequency signals from the RF generator 108. These high frequency signals, for example, may have frequencies from about 1 MHz to 200 MHz such as, for example, greater than about 1 MHz or 10 MHz. The filter inductor 180, for example, may have values from about 10 nH to 10 μH such as, for example, greater than about 1 μH. In some embodiments, the filter inductor 180 may have a low coupling capacitance across it. In some embodiments, the coupling capacitance may be less than 1 nF.

Figure 12:
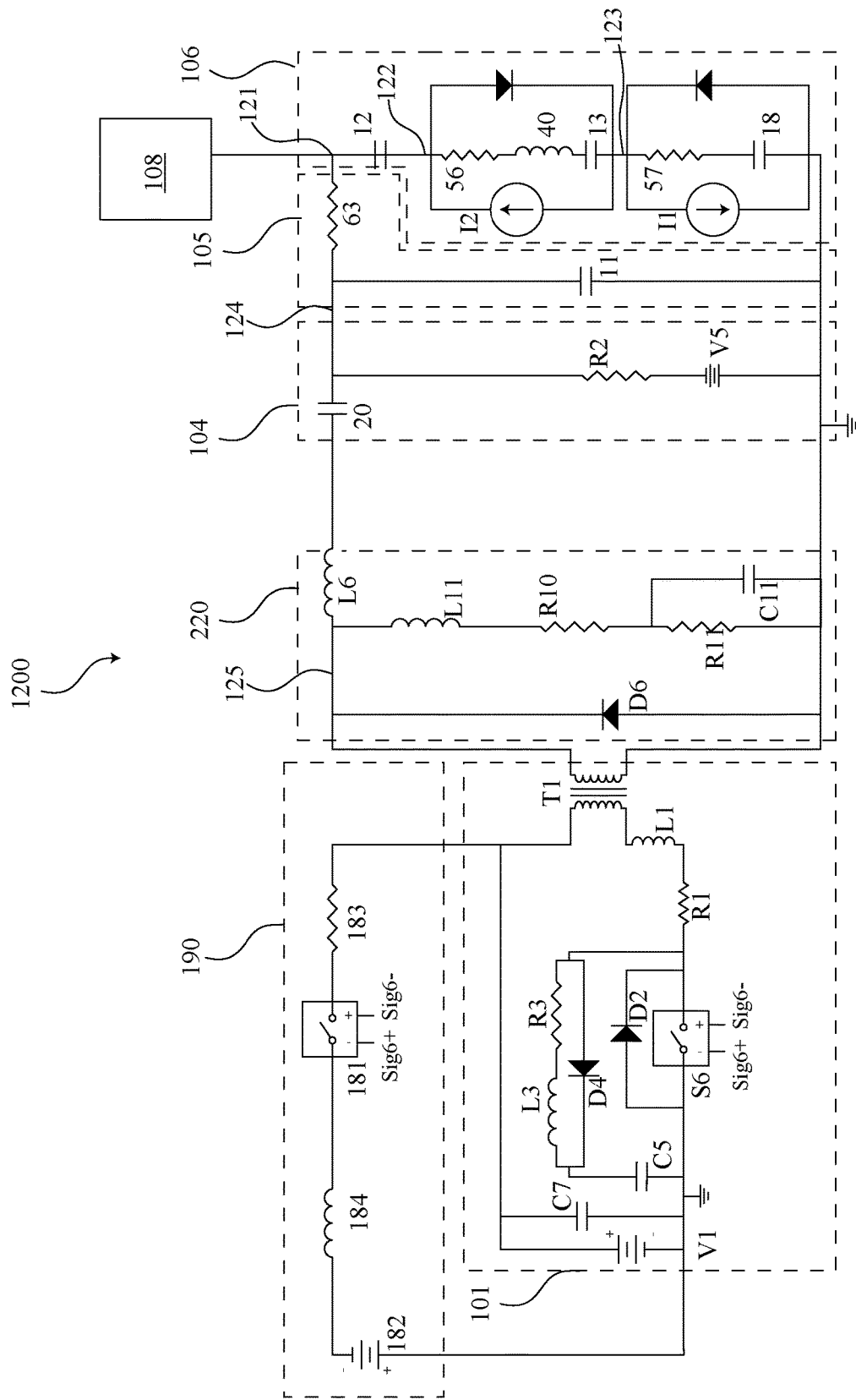
FIG. 12 is a circuit diagram of a power system with a droop compensation circuit driving a load stage according to some embodiments.

FIG. 12 is a circuit diagram of a pulser and plasma system 1200 with a droop compensation circuit 190 driving a plasma chamber 106 according to some embodiments. The droop compensation circuit 190 may include a negative DC source 182, a switch 181 and a current-limiting resistor 183 or current-limiting inductor 184. The current-limiting resistor 183, for example, may have a resistance of about 0.1 Ω to about 50 Ω or about 10 Ω to about 500Ω. The current-limiting inductor 184, for example, may have an inductance of about 1 nH to about 100. nH. When the switch 181 is closed, the negative DC source 182 can pull down the voltage removing and limiting the droop.

The switch 181 may include any type of switch that can switch high voltages at high frequencies. In some embodiments, the switch 181 comprises a high voltage switch described in U.S. Patent Application No. 62/717,637, titled "HIGH VOLTAGE SWITCH FOR NANOSECOND PULS-ING," and/or in U.S. patent application Ser. No. 16/178,565, titled "HIGH VOLTAGE SWITCH FOR NANOSECOND PULSING," which is incorporated into this disclosure in its entirety for all purposes.

In some embodiments, the pulser and plasma system 1200 may include an energy recovery circuit (e.g., energy recovery circuit 110) rather than the resistive output stage 220.

The pulser and plasma system 1200 may include an RF generator 108 and filter inductor 180 The filter inductor 180, for example, may filter high frequency signals from the RF generator 108. These high frequency signals, for example, may have frequencies from about 1 MHz to 200 MHz such as, for example, greater than about 1 MHz or 10 MHz. The filter inductor 180, for example, may have values from about 10 nH to 10 μH such as, for example, greater than about 1 μH. In some embodiments, the filter inductor 180 may have a low coupling capacitance across it. In some embodiments, the coupling capacitance may be less than 1 nF.

Figure 13:
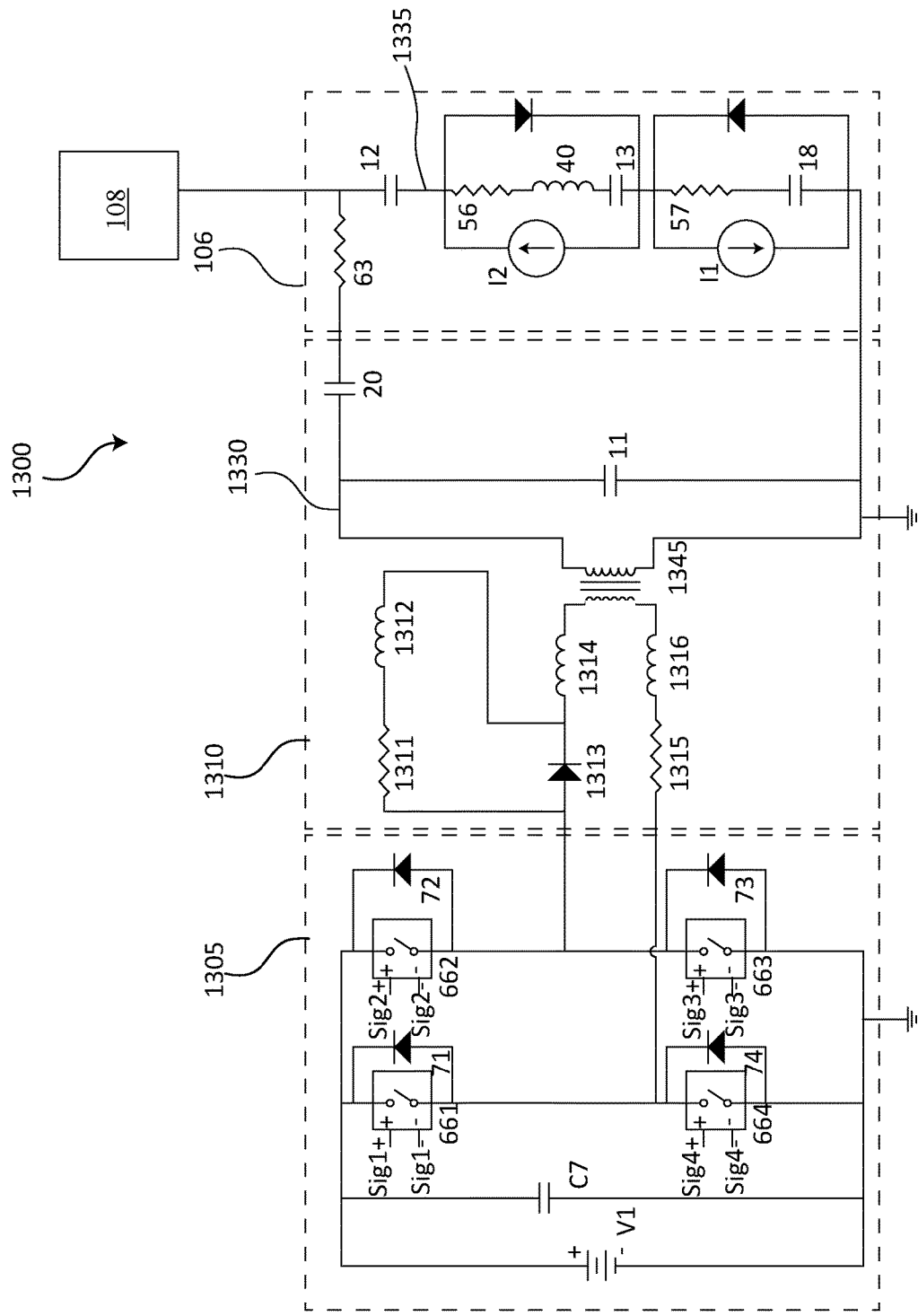
FIG. 13 is a circuit diagram of a pulser and plasma system according to some embodiments.

FIG. 13 is a circuit diagram of a pulser and plasma system 1300 according to some embodiments. The pulser and plasma system 1300, for example, may include a pulse driver 1305, which is shown in a full bridge configuration but may also be in a half bridge configuration; a droop compensation circuit 1310, a transformer 1345; and a DC source V1. The droop compensation circuit 1310 for example may mitigate or decrease voltage droop within the plasma chamber such as, for example, on the wafer within the plasma chamber.

The pulse driver 1305, for example, may produce bipolar pulses. A bipolar pulse, for example, may include a pulse that includes a positive going pulse followed by a negative going pulse. The peak-to-peak voltage between the positive going pulse and the negative going pulse may be greater than about 500 V, 1 kV, 2 kV, 5 kV, 10 kV, 15 kV, 20 kV, etc.

In this example, the pulser and plasma system 1300 may include a pulse driver 1305. The pulse driver 1305, for example, may be a half-bridge driver or a full-bridge driver. The pulse driver 1305 may include a DC source V1, which may be a DC source (e.g., a capacitive source, AC-DC converter, etc.). In some embodiments, the pulse driver 1305 may include four bridge switches 661, 662, 663, 664. In some embodiments, the pulse driver 1305 may include a plurality of switches 661, 662, 663, and 664 in series or in parallel. These switches 661, 662, 663, and 664, for example, may include any type of solid-state switch such as, for example, IGBTs, a MOSFETs, a SiC MOSFETs, SiC junction transistors, FETs, SiC switches, GaN switches, photoconductive switches, etc. These switches 661, 662, 663, and 664 may be switched at high frequencies and/or may produce a high voltage pulses. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

Each switch of switches 661, 662, 663, and 664 may be coupled in parallel with a respective bridge diode and may include stray inductance. In some embodiments, the stray inductances of the bridge switches may be equal. In some embodiments, the stray inductances of the bridge switches may be less than about 50 nH, 100 nH, 150 nH, 500 nH, 1,000 nH, etc. The combination of a switch (661, 662, 663, or 664) and a respective bridge diode may be coupled in series with a respective bridge inductor. For example, the bridge inductors associated with switches 663 and 664 may be connected with ground. For example, the bridge inductor associated with the switch 661 may be electrically connected with bridge switch 664 and the resistor 1315 and/or inductor 1316 of the droop compensation circuit 1310. And the bridge inductor associated with the switch 662, for example, may be electrically connected with bridge switch 663 and the diode 1313 of the droop compensation circuit 1310.

If the switches in the pulse driver 1305 are switched at the resonant frequency, fresonant, then the output voltage at the transformer 1345 will be amplified. In some embodiments, the resonant frequency may be about 400 kHz, 0.5 MHz, 2.0 MHz, 4.0 MHz, 13.56 MHz, 27.12 MHz, 40.68 MHz, 50 MHz, etc.

In some embodiments, the transformer 1345 (or the transformer T1) may comprise a transformer as disclosed in U.S. patent application Ser. No. 15/365,094, titled "High Voltage Transformer," which is incorporated into this document for all purposes.

For example, the duty cycle of the switches can be adjusted by changing the duty cycle of signal Sig1, which opens and closes bridge switch 661; changing the duty cycle of signal Sig2, which opens and closes bridge switch 662; changing the duty cycle of signal Sig3, which opens and closes bridge switch 663; and changing the duty cycle of signal Sig4, which opens and closes bridge switch 664.

In some embodiments, each bridge switch 661, 662, 663, or 664 in the pulse driver 1305 can be switched independently or in conjunction with one or more of the other switches. For example, the signal Sig1 may be the same signal as signal Sig3. As another example, the signal Sig2 may be the same signal as signal Sig4. As another example, each signal may be independent and may control each bridge switch 661, 662, 663, or 664 independently or separately.

In some embodiments, the output of the droop compensation circuit 1310 may be coupled with a half-wave rectifier that may include a blocking diode, which may be located on the secondary side of the transformer 1345 or the primary side of the transformer 1345.

In some embodiments, the output of the droop compensation circuit 1310 may be coupled with a resistive output stage such as, for example, resistive output stage 220 shown in FIG. 12. A resistive output stage may include any resistive output stage known in the art. For example, the resistive output stage may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes.

The pulser and plasma system 1300 does not include a traditional matching network such as, for example, a 50Ω matching network or an external matching network or standalone matching network. Indeed, the embodiments described within this document do not require a 50Ω matching network to tune the switching power applied to the wafer chamber. In addition, embodiments described within this document provide a variable output impedance RF generator without a traditional matching network. This can allow for rapid changes to the power drawn by the plasma chamber. Typically, this tuning of the matching network can take at least 100 µs-200 µs. In some embodiments, power changes can occur within one or two RF cycles, for example, 2.5 µs-5.0 µs at 400 kHz.

In some embodiments, the pulse driver 1305 may comprise switches arranged in a full bridge topology as shown or a half bridge topology with two switches. The switches 661, 662, 663, 664 may switch DC charge stored within the energy storage capacitor C7. The DC source V1, which may be a DC source (e.g., a capacitive source, AC-DC converter, etc.), may charge the energy storage capacitor C7. The pulse driver 1305, for example, may or may not drive the droop compensation circuit 1310 with a pulse frequency that is or is not substantially equal to the resonate frequency of the droop compensation circuit 1310.

In some embodiments, the pulse driver 1305 may be replaced with a half bridge topology with two switches The droop compensation circuit 1310 may include diode 1313, inductor 1312, inductor 1314, inductor 1316, resistor 1315, and/or resistor 1311. The diode 1313 may be forward biased between the pulse driver 1305 and the transformer 1345. Resistor 1315, for example, may be very small. For example, resistor 1315 may have a resistance less than about 1 Ω such as, for example, about 50, 25, 10, 5, etc. mΩ. As another example, resistor 1315 may be as low as 0Ω. Resistor 1311, for example, may be very small. For example, resistor 1311 may have a resistance less than about 5 Ω such as, for example, about 10, 5, 2, 1, 0.75, 0.5, 0.25 Ω etc. The inductor 1316 and/or the inductor 1314, for example, may have an inductance less than about 100 nH such as, for example, about 75, 50, 25, 10, 5, etc. nH.

The inductor 1312, for example, may have an inductance less than about 100 µH such as, for example, less than about 100, 50, 25, 10, 5, 2.5 1 µH, etc.

The pulser and plasma system 1300, for example, may include an RF generator 108 and filter inductor 180 The filter inductor 180, for example, may filter high frequency signals from the RF generator 108. These high frequency signals, for example, may have frequencies from about 1 MHz to 200 MHz such as, for example, greater than about 1 MHz or 10 MHz. The filter inductor 180, for example, may have values from about 10 nH to 10 µH such as, for example, greater than about 1 µH. In some embodiments, the filter inductor 180 may have a low coupling capacitance across it. In some embodiments, the coupling capacitance may be less than 1 nF.

The DC source V1, for example, may include multiple DC sources. For example, one DC source may be coupled with one or two switches and a second DC source may be coupled with another one or two switches.

Figure 14:
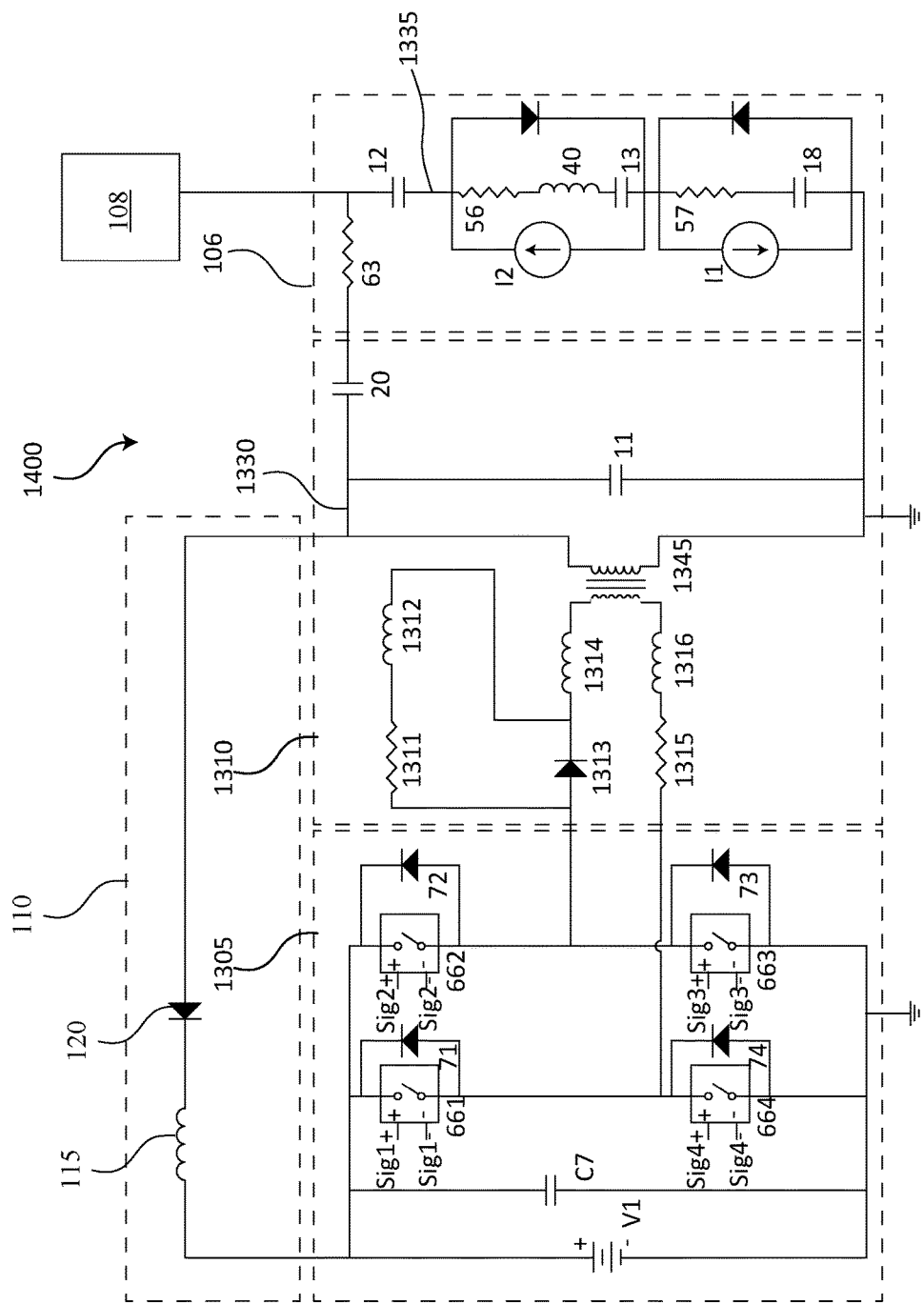
FIG. 14 is a circuit diagram of a pulser and plasma system that is includes the combines pulser and plasma system with the energy recovery circuit.

FIG. 14 is a circuit diagram of a pulser and plasma system 1400 that is includes the combines pulser and plasma system 1300 with the energy recovery circuit 110. The energy recovery circuit 110, for example, may include an energy recovery diode 120 and/or an energy recover inductor 115. When the switches 661, 662, 663, 664 are open, excess charge may flow, for example, from the secondary side of the transformer 1345 to charge the DC source V1. As another example, instead of combining the energy recovery circuit 110 with the pulser and plasma system 1300 the droop compensation circuit 190 may be combined with pulser and plasma system 1300.

Unless otherwise specified, the term "substantially" means within 5% or 10% of the value referred to or within manufacturing tolerances. Unless otherwise specified, the term "about" means within 5% or 10% of the value referred to or within manufacturing tolerances.

Figure 15A:
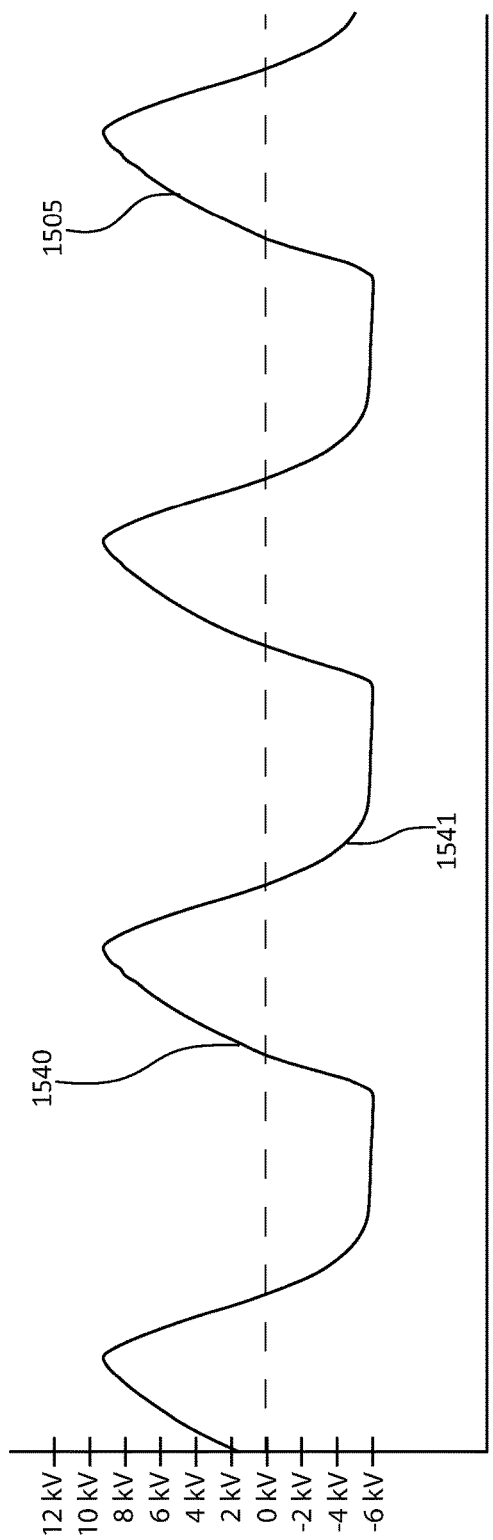
FIG. 15A and FIG. 15B show waveforms from the pulser shown in FIG. 13 or FIG. 14 without droop compensation.
Figure 15B:
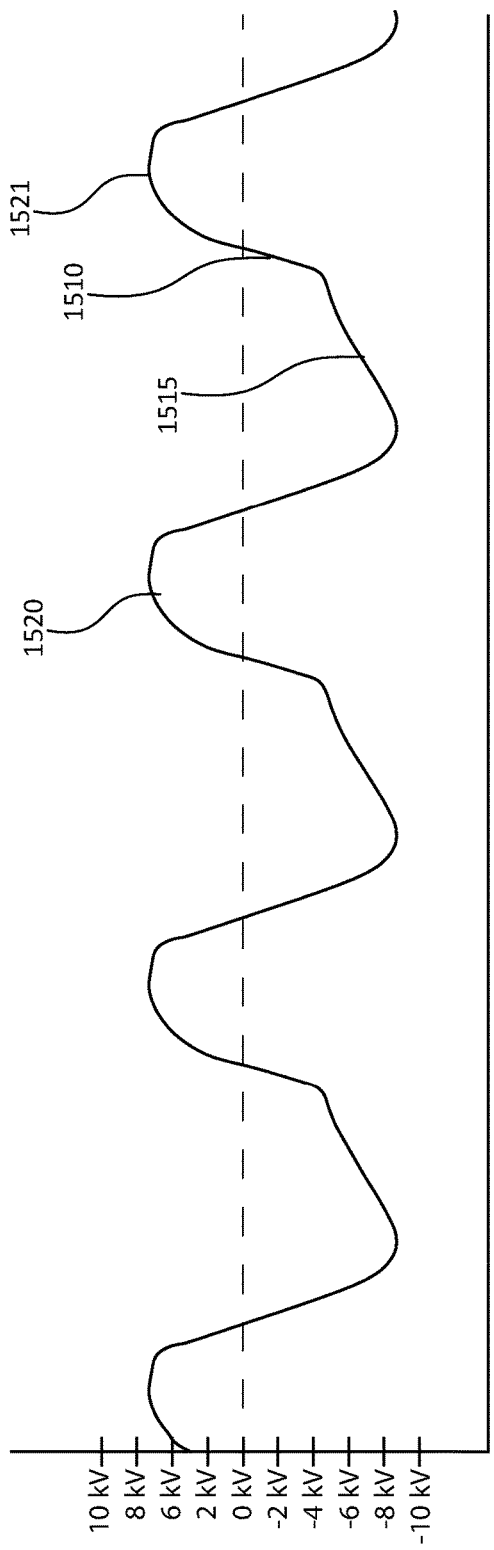

FIG. 15A shows bipolar waveform 1505 produced, for example, from the pulse driver 1305 without droop correction (e.g., without all or portions of the droop compensation circuit 1310). This waveform shows the voltage over time as recorded at point 1330 in FIG. 13. FIG. 15B shows bipolar waveform 1510, for example, from the pulse driver 1305 without droop correction measured at some point within a plasma chamber such as, for example, at point 1335 in FIG. 13 (e.g., within the plasma chamber, at the chuck, or on the wafer). As shown in FIG. 15B, the waveform 1510 has a positive going droop 1515 between positive pulse 1520 and positive pulse 1521. This droop 1515 may be repeated between each and every pulse of the waveform 1510. This droop 1515, for example, may reduce the magnitude of voltage over time between the pulses 1520, 1521 at a point within the plasma chamber to a substantially flat voltage over time.

As shown in waveform 1505, a bipolar pulse is a high voltage pulse that has a positive going portion 1540 and a negative going portion 1541. The positive going portion 1540, for example, may be a triangle pulse, a square pulse, a gaussian-shaped pulse, a sinusoidal-shaped pulse, etc. The negative going portion 1541, for example, may be a triangle pulse, a square pulse, a gaussian-shaped pulse, a sinusoidal-shaped pulse, etc.

Figure 16A:
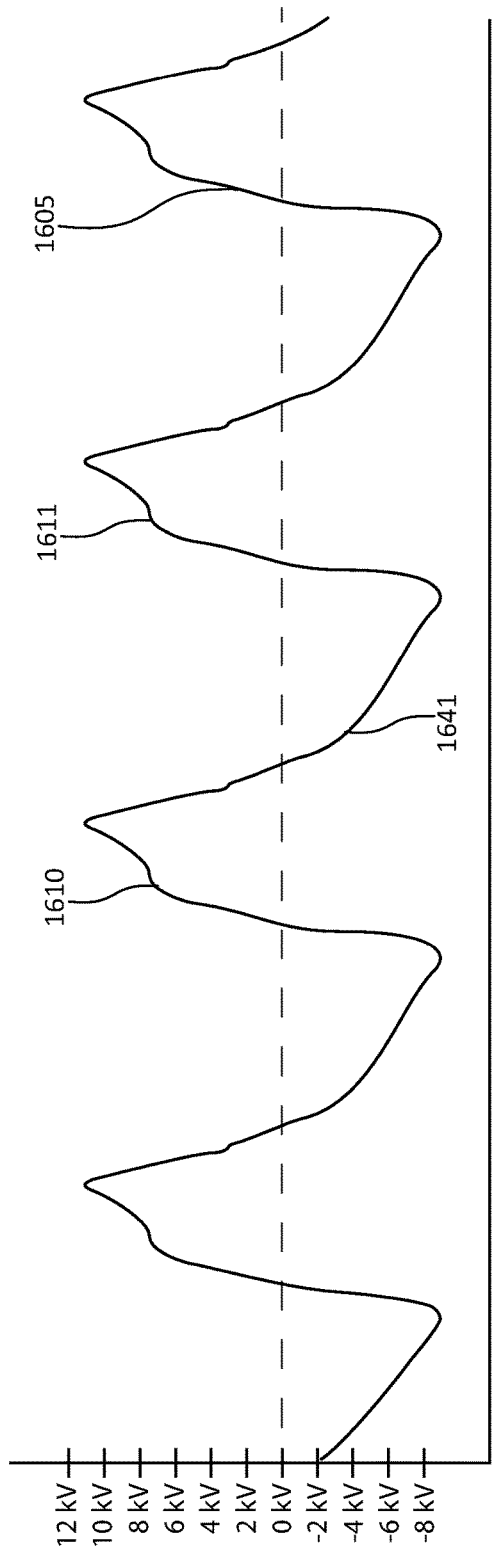
FIG. 16A and FIG. 16B show waveforms from the pulser shown in FIG. 13 or FIG. 14 with droop compensation.
Figure 16B:
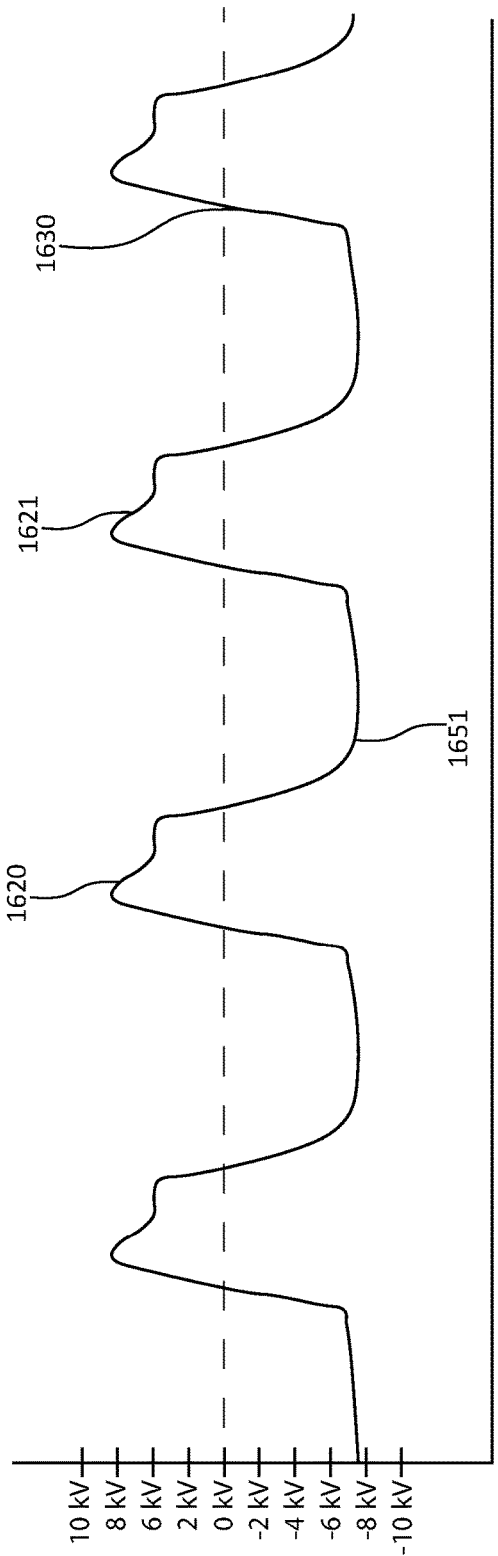

FIG. 16A shows bipolar waveform 1605 produced, for example, from the pulse driver 1305 with droop correction. This waveform shows the voltage over time as recorded at point 1330 in FIG. 13. FIG. 16B shows bipolar waveform 1630, for example, from the pulse driver 1305 with droop correction measured at some point within a plasma chamber such as, for example, at point 1335 in FIG. 13 (e.g., at the chuck or on the wafer).

As shown in FIG. 16A, droop correction causes the portion of the waveform between two consecutive positive going pulses (e.g., positive going pulse 1610 and positive going pulse 1611) as produced from the pulse driver 1305 to have a negative slope 1641. The magnitude of the negative slope, for example, may be greater than about 10,000,000, 1,000,000, 500,000, 100,000, 50,000, 10,000 kV/s, etc. The period between consecutive positive pulses, for example, may be less than about 10,000, 1,000, 100, 10 ns etc.

As shown in FIG. 16B, the droop correction causes the portion of the bipolar waveform, between consecutive pulses 1620, 1621, as measured within the plasma chamber, to have a substantially flat slope 1651. The magnitude of the substantially flat slope 1651, for example, may be less than about 100, 10, 1 kV/s etc. such as, for example, as measured from the knee of the fall time of the pulse 1620 to the knee in the rise time of the pulse 1621. The magnitude of the substantially flat slope 1651, for example, may produce a producing a nearly constant negative potential on the wafer between the positive portions of the pulses 1620 to 1621. The portion of the period between consecutive bipolar pulses that comprises the substantially flat slope, for example, can include more than 50%, 60%, 70%, or 80 of the period between consecutive bipolar pulse.

As shown in FIG. 9, the chucking waveform 915 (or the output voltage from the pulser) has a negative slope between consecutive pulses. This negative slope, for example, can compensate for a voltage reduction on a wafer within the plasma chamber due to an ion current. This negative slope, for example, can have a magnitude that is substantially equal and opposite the ratio of an ion current produced within the plasma chamber and a chuck capacitance of the plasma chamber.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Embodiments of the methods disclosed may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A pulse generator comprising:
   a DC source;
   a transformer comprising:
      a transformer core;
      a primary winding wrapped around at least a portion of the transformer core, the primary winding having a first lead and a second lead; and
      a secondary winding wrapped around at least a portion of the transformer core;
   a droop compensation circuit electrically coupled with first lead of the primary winding;
   a first switch electrically connected with the droop compensation circuit and the DC source;
   a second switch electrically connected with the second lead of the primary winding and the DC source, wherein the first switch and the second switch are opened and closed at different time intervals; and
   a pulsing output electrically coupled with the secondary winding of the transformer that outputs high voltage bipolar pulses having a peak-to-peak voltage greater than 1 kV and a voltage portion between consecutive high voltage bipolar pulses that has a negative slope.

2. The pulse generator according to claim 1, wherein the voltage portion comprises more than 50% of a period between consecutive high voltage bipolar pulses.

3. The pulse generator according to claim 1, wherein the voltage portion is the voltage between the knee of the fall of a high voltage bipolar pulses and a knee of the rise of a consecutive high voltage bipolar pulses.

4. The pulse generator according to claim 1, wherein the voltage portion is the voltage between the end of a high voltage bipolar pulses and a beginning of a consecutive high voltage bipolar pulses.

5. The pulse generator according to claim 1, wherein the magnitude of the negative slope is greater than 100,000 kV/s.

6. The pulse generator according to claim 1, wherein the droop compensation circuit includes a droop diode biased to allow current to flow through the first switch and through the transformer.

7. The pulse generator according to claim 6, wherein the droop compensation circuit includes a first inductor and a first resistor arranged in series and electrically coupled across the droop diode.

8. The pulse generator according to claim 7, wherein the first inductor has an inductance less than about 100 μH.

9. The pulse generator according to claim 7, wherein the first resistor has a resistance less than about 5 Ω.

10. The pulse generator according to claim 7, wherein the droop compensation circuit further comprises a second inductor electrically coupled with the droop diode and the first lead of the primary winding.

11. The pulse generator according to claim 10, wherein second inductor has an inductance is less than about 50 nH.

12. The pulse generator according to claim 10, further comprising a third resistor and a third inductor arranged in series between the second switch and the second lead of the primary winding.

13. The pulse generator according to claim 12, wherein third inductor has an inductance less than about 35 nH.

14. The pulse generator according to claim 12, wherein the third resistor has a resistance less than about 1 Ω.

* * * * *